United States Patent
Iwamatsu et al.

(10) Patent No.: US 8,513,058 B2
(45) Date of Patent: Aug. 20, 2013

(54) SEMICONDUCTOR DEVICE AND METHOD FOR PRODUCING THE SAME

(75) Inventors: Toshiaki Iwamatsu, Kanagawa (JP); Yuichi Hirano, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/019,686

(22) Filed: Feb. 2, 2011

(65) Prior Publication Data

US 2011/0186936 A1    Aug. 4, 2011

(30) Foreign Application Priority Data

Feb. 3, 2010    (JP) ................................. 2010-021933

(51) Int. Cl.
*H01L 25/00*    (2006.01)
*H01L 23/52*    (2006.01)

(52) U.S. Cl.
USPC ........... 438/109; 257/278; 257/334; 257/763; 257/777; 257/E21.141; 257/E21.614; 257/E21.616; 257/E23.141; 438/59; 438/118; 438/455

(58) Field of Classification Search
USPC .................... 438/59, 109, 118, 455; 257/278, 257/334, 763, 777, E21.141, E21.614, E21.616, 257/E23.141
See application file for complete search history.

(56) References Cited

U.S. PATENT DOCUMENTS

| 4,612,083 | A | * | 9/1986 | Yasumoto et al. | 438/59 |
| 6,846,703 | B2 | * | 1/2005 | Shimoda et al. | 438/109 |
| 7,554,169 | B2 | * | 6/2009 | Anzai et al. | 257/444 |
| 8,044,946 | B2 | * | 10/2011 | Yamazaki et al. | 345/204 |
| 8,101,996 | B2 | * | 1/2012 | Wang | 257/334 |
| 2007/0001312 | A1 | | 1/2007 | Murayama et al. | |
| 2012/0032348 | A1 | * | 2/2012 | Yu et al. | 257/777 |

FOREIGN PATENT DOCUMENTS

JP    11-340315 A    12/1999
JP    2007-012854 A    1/2007

* cited by examiner

*Primary Examiner* — Dao H Nguyen
(74) *Attorney, Agent, or Firm* — McDermott Will & Emery LLP

(57) ABSTRACT a method for producing a semiconductor device provided in such a manner that a first layer and a second layer are laminated to ensure that their TSVs are arranged in almost a straight line, including: first layer production steps including steps of preparing a substrate, forming a transistor of an input/output circuit on an upper surface of the substrate, forming an insulation layer so as to cover the transistor, and forming a TSV in the insulation layer; second layer production steps including steps of preparing a substrate, forming a transistor of a logic circuit on an upper surface of the substrate, forming an insulation layer so as to cover the transistor, and forming a TSV in the insulation layer; a connection step of connecting surfaces of the first layer and the second layer on a side opposite to substrates of the first layer and the second layer to ensure that the TSV of the first layer and the TSV of the second layer are arranged in almost a straight line; and a step of removing the substrate of the first layer.

16 Claims, 27 Drawing Sheets

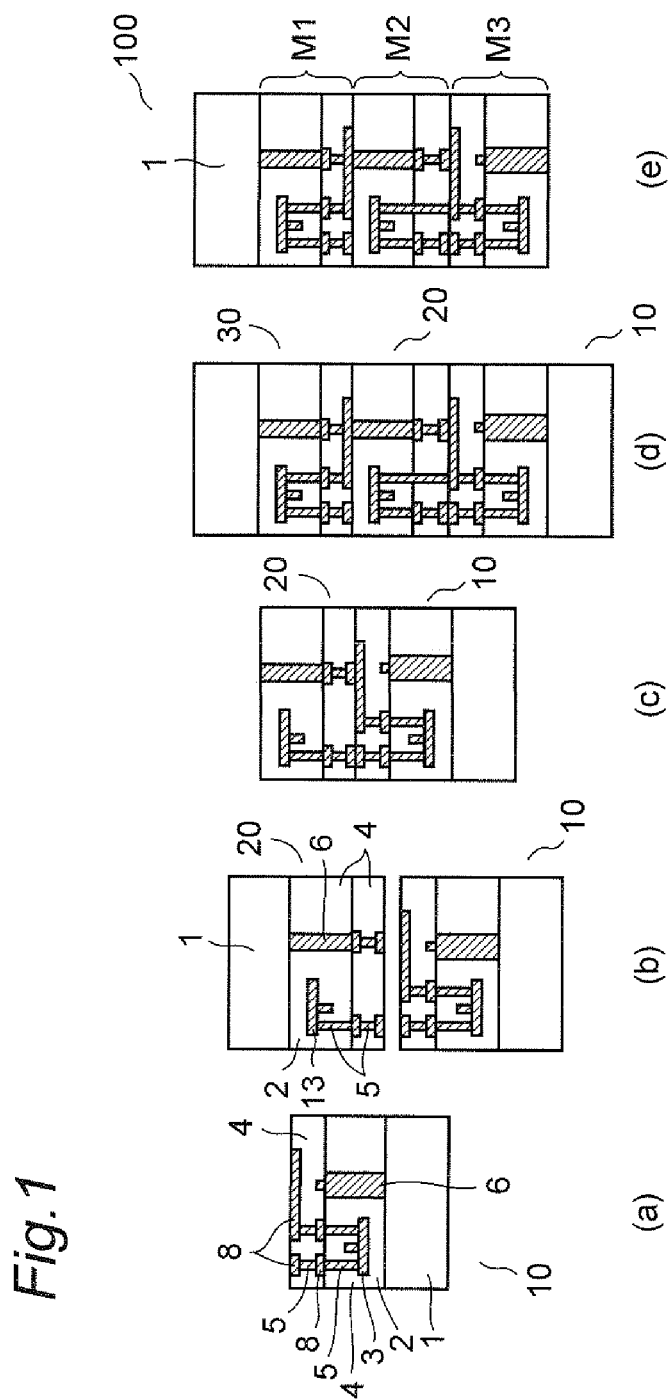

Fig.2A
(a)
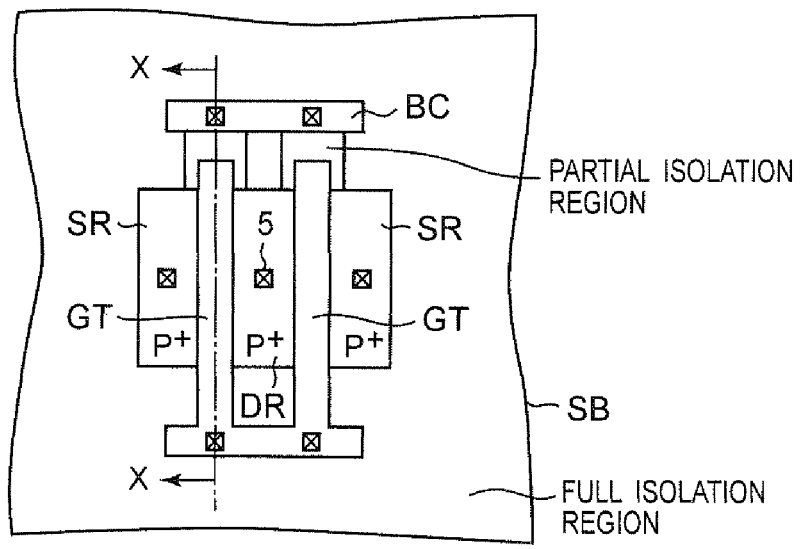
(b)
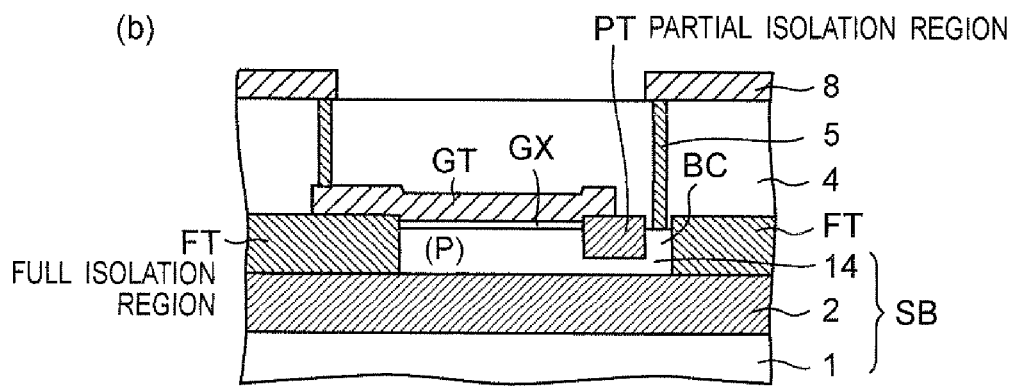
PT: PARTIAL TRENCH ISOLATION INSULATION REGION
FT: FULL TRENCH ISOLATION INSULATION REGION

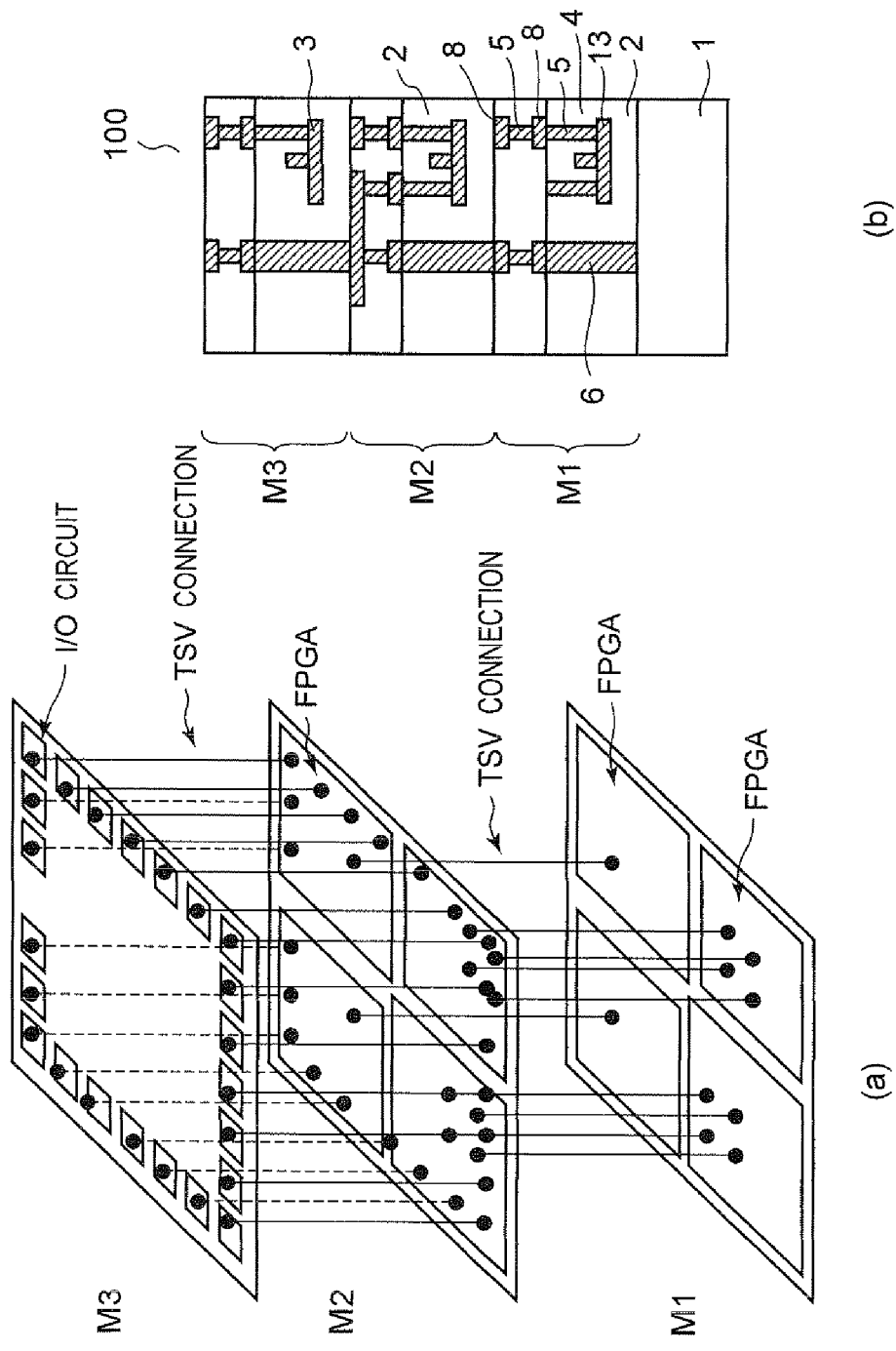

SEMICONDUCTOR DEVICE AND METHOD FOR PRODUCING THE SAME

BACKGROUND OF THE INVENTION

1. Field of the Invention

The present invention relates to a semiconductor device and a method for producing the same and, more particularly, to a semiconductor device having a multilayer structure employing a TSV, and a method for producing the same.

2. Description of the Related Art

FIG. 25 is a cross-sectional view of steps in a method for producing a conventional semiconductor device, and the steps include the following steps 1 to 5.

Step 1: as shown in FIG. 25(a), a substrate 1 is prepared and a BOX layer (buried oxide layer) 2 is deposited thereon. Then, semiconductor elements 13 of a logic circuit such as an FPGA (Field Programmable Gate Array) are formed on the BOX layer 2. The semiconductor elements include elements such as an SOI transistor having an SOI structure, and a capacitor.

Then, an insulation layer 4 is formed and an opening part is provided in the insulation layer 4 to form a via hole 5. In addition, an opening part is provided in the insulation layer 4 and the BOX layer 2 to form a TSV (Through Silicon Via) 6.

Then, a wiring layer 8 is formed and the insulation layer 4 is deposited. Then, the via hole 5 and the wiring layer 8 are formed by a process such as a damascene process. Through the above steps, a first layer 10 is produced.

Step 2: as shown in FIG. 25(b), a second layer 20 is formed. The second layer 20 is provided in such a manner that the BOX layer 2 is formed on the substrate 1, and components such as the semiconductor elements 13, the via hole 5, and the wiring layer 8 are provided thereon. The semiconductor elements 13 include a logic circuit such as the FPGA.

Step 3: as shown in FIG. 25(c), the substrate 1 of the second layer 20 is removed by a method such as a CMP method to expose the TSV 6.

Step 4: as shown in FIG. 25(d), a third layer 30 is formed. The third layer 30 is provided in such a manner that the BOX layer 2 is formed on the substrate 1, and components such as semiconductor elements 3 of an I/O circuit (input/output circuit), the via hole 5, and the wiring layer 8 are provided thereon. Then, the third layer 30 is laminated on the second layer 20 in such a manner that the wiring layer 8 of the third layer 30 comes into contact with the TSV 6 of the second layer 20.

Step 5: as shown in FIG. 25(e), the substrate 1 of the third layer 30 is removed by a method such as the CMP method. Through the above steps, a semiconductor device (three-dimensional device) 1000 having the three laminated layers M1, M2, and M3 on the substrate 1 is completed.

In the semiconductor device 1000 having the multilayer structure such as the three-dimensional device, since the TSVs 6 have a large cross-sectional area, they need to be arranged in almost a straight line in a direction perpendicular to the substrate 1, as a layout arrangement. Therefore, when the above production method is used, layouts (positions of the semiconductor elements 13 and the TSV 6) of the second layer 20 and the third layer 30 need to be almost mirror-symmetrical to a layout of the first layer 10 with respect to a plane parallel to the substrate 1.

However, in order to form the second layer 20 and the third layer 30 having the mirror-symmetrical layouts, based on the layout of the first layer 10, it is necessary to change a mask, a CAD layout, and a circuit verification tool. Especially, in the conventional method, since the second layer 20 includes the semiconductor elements 13 of the logic circuit, operations to redesign the logic circuit to be mirror-symmetrical and manufacture a corresponding mask are very complicated, which causes production cost to increase.

In view of the above circumstances, focusing on the fact that an I/O circuit (input/output circuit) is very easy to design and manufacture a mirror-symmetrical layout as compared with the logic circuit, the inventors completed the present invention in which only the I/O circuit (input/output circuit) is made in the mirror-symmetrical layout.

SUMMARY OF THE INVENTION

Accordingly, an object of the present invention is to provide a method for producing a semiconductor device having a multilayer wiring such as a three-dimensional device by simpler steps.

The present invention is a method for producing a semiconductor device provided in such a manner that a first layer and a second layer are laminated to ensure that their TSVs are arranged in almost a straight line, including: first layer production steps including steps of preparing a substrate, forming a transistor of an input/output circuit on an upper surface of the substrate, forming an insulation layer so as to cover the transistor, and forming a TSV in the insulation layer; second layer production steps including steps of preparing a substrate, forming a transistor of a logic circuit on an upper surface of the substrate, forming an insulation layer so as to cover the transistor, and forming a TSV in the insulation layer; a connection step of connecting surfaces of the first layer and the second layer on a side opposite to substrates of the first layer and the second layer to ensure that the TSV of the first layer and the TSV of the second layer are arranged in almost a straight line; and a step of removing the substrate of the first layer.

Further, the present invention is a semiconductor device having a two-layer structure including at least: a first layer including a substrate, a first transistor of an input/output circuit formed on an upper surface of the substrate, a first interlayer insulation layer formed so as to cover the first transistor, and a first TSV formed in the first interlayer insulation layer; and a second layer including a second transistor of a logic circuit formed on the first layer, a second interlayer insulation layer formed so as to cover the second transistor, and a second TSV formed in the second interlayer insulation layer, wherein the first TSV of the first layer and the second TSV of the second layer are arranged so as to be provided in almost a straight line, and the gate electrode side of the first transistor of the first layer is arranged so as to be opposed to the second layer, and the gate electrode side of the second transistor is arranged so as to be opposed to the first layer.

As described above, according to the method for producing the semiconductor device in the present invention, only the layer having the I/O circuit is made in a mirror-symmetrical layout, and the layer having the logic circuit is made in a normal layout, whereby the semiconductor device having the multilayer wiring structure can be more easily produced.

In addition, in the semiconductor device in the present invention, delay due to a long distance wiring can be prevented, and high speed and low power consumption can be implemented. Furthermore, a degree of freedom of a layout of a wiring layer is also improved.

BRIEF DESCRIPTION OF THE DRAWINGS

FIG. 1 is a cross-sectional view showing steps of producing a semiconductor device according to a first embodiment of the present invention;

FIG. 2A is a partial plan view and a partial cross-sectional view of the semiconductor device according to the first embodiment of the present invention;

FIG. 2C is a view showing the multilayer structure of the semiconductor device according to the first embodiment of the present invention;

DETAILED DESCRIPTION OF THE PREFERRED EMBODIMENTS

First Embodiment

Figure 2B:
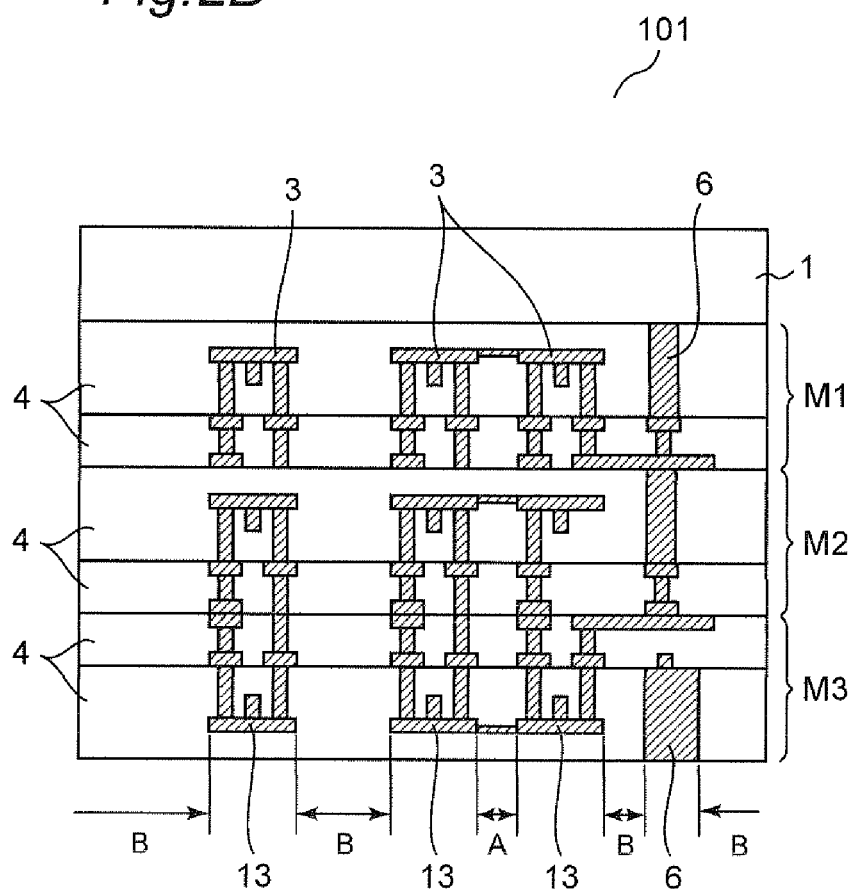
FIG. 2B is a view showing a multilayer structure of the semiconductor device according to the first embodiment of the present invention.

FIG. 1 is a cross-sectional view of steps of producing a semiconductor device according to a first embodiment of the present invention, which is entirely represented by 100 and a production method includes the following steps 1 to 5. Note that in the following description, a "normal layout" means a conventionally used normal layout, and a "mirror layout" means a layout which is a roughly mirror-symmetrical to the "normal layout" about a plane parallel to a substrate.

Step 1: as shown in FIG. 1(a), a substrate 1 such as a Si substrate is prepared, and a BOX layer (buried oxide layer) 2 is deposited thereon. Then, a semiconductor layer is formed on the BOX layer 2, and in this semiconductor layer, semiconductor elements 3 such as an SOI transistor having an SOI structure, a capacitor, and a resistor are formed. An isolation structure around the semiconductor elements includes a full isolation structure in which an isolation insulation layer (not shown) between elements reaches the BOX layer 2, and a partial isolation structure in which an isolation insulation layer between the elements does not reach the BOX layer 2 and a semiconductor layer (not shown) remains between the isolation insulation layer and the BOX layer 2. The isolation structure including the two kinds of full isolation and partial isolation is called a hybrid trench isolation (HTI) structure. The hybrid trench isolation structure will be described in detail below. In this step, an I/O circuit (input/output circuit) is made as the semiconductor elements 3.

Then, an insulation layer 4 is formed of a material such as $SiO_2$ and then an opening part is provided in the insulation layer 4 and a material such as W is embedded therein to form a via hole 5. On the other hand an opening part is provided in the insulation layer 4 and the BOX layer 2 and a material such as Cu is embedded therein to form a TSV (Through Silicon Via) 6. Note that since the BOX layer 2 and the insulation layer 4 are formed of the same material in general, an interface between them is not shown here. In addition, the full isolation structure is provided in the region of the TSV.

Then, a wiring layer 8 is formed of a material such as Cu and the insulation layer 4 is deposited. Then, the via hole 5 and the wiring layer 8 are formed by a process such as a damascene process. Through the above steps, a first layer 10 is produced. A layout of the first layer is the mirror layout with respect to layouts of a second layer 20 and a third layer 30 as will be described below.

Step 2: as shown in FIG. 1(b), the second layer 20 (normal layout) is produced, and bonded to the first layer 10 face-to-face. At this time, a heating bonding at about 200° C. is used. As will be described below, a solder bump may be used in this bonding process.

In the second layer 20, the BOX layer 2 is formed on the substrate 1, and semiconductor elements 13 including an SOI transistor and a capacitor, the via hole 5, the wiring layer 8 are provided thereon. The semiconductor elements are isolated by the partial isolation structure, the full isolation structure, or the hybrid isolation structure. In addition, the full isolation structure is provided in the region of the TSV. The semiconductor elements 13 include a logic circuit such as a FPGA (Field Programmable Gate Array).

Step 3: as shown in FIG. 1(c), the substrate 1 of the second layer 20 is removed by a method such as a CMP method to expose the TSV 6.

Step 4: as shown in FIG. 1(d), the third layer 30 having almost the same structure as that of the second layer 20 is produced. In the third layer 30, the BOX layer 2 is formed on the substrate 1, and the semiconductor elements 13 including the SOI transistor and the capacitor, the via hole 5, the wiring layer 8 are provided thereon to configure the logic circuit such as the FPGA. The semiconductor elements are isolated by the partial isolation structure, the full isolation structure, or the hybrid isolation structure. In addition, the full isolation structure is provided in the region of the TSV. Then, the third layer 30 (normal layout) is bonded onto the second layer 20 in such a manner that the wiring layer 8 of the third layer 30 comes into contact with the TSV 6 of the second layer 20.

Step 5: as shown in FIG. 1(e), the substrate 1 of the first layer 10 is removed by a method such as the CMP method. Thus, through the above steps, the semiconductor device (three-dimensional device) 100 having the three laminated layers M1, M2, and M3 on the substrate 1 is completed.

In the semiconductor device 100 according to the first embodiment, as shown in FIG. 1(e), the layers M1 and M2 formed on the substrate 1 have the normal layout, and only the layer M3 has the mirror layout which is mirror-symmetric to the normal layouts of the layers M1 and M2. The TSVs 6 of the three layers M1, M2, and M3 are arranged in almost a straight line in a direction perpendicular to the substrate 1.

The layer M3 has the I/O circuit (input/output circuit) which is relatively easy to manufacture the mirror layout and simple in circuit structure as compared with the logic circuit, and does not have the logic circuit which is hard to manufacture the mirror layout. Therefore, the production steps including a step of forming a mask to make the mirror layout can be relatively easy to be performed.

Especially, the semiconductor device having the multilayer structure can be produced with two sets of masks for the layers M1 and M2 (logic circuits) and for the layer M3 (I/O circuit), its production cost can be cut.

FIG. 2A shows a part of the semiconductor device according to the first embodiment of the present invention, in which FIG. 2A(a) is a plan view, and FIG. 2A(b) is a cross-sectional view taken along a line X-X in FIG. 2A(a). In FIG. 2A, the same reference as that in FIG. 1 shows the same or corresponding part. In addition, GT represents a gate electrode, GX represents a gate oxide film, SR represents a semiconductor layer, SB represents an SOI substrate, PT represents a partial trench isolation insulation layer, and FT represents a full trench isolation insulation layer.

As shown in FIG. 2A(b), the SOI substrate SB includes the semiconductor substrate 1, the BOX layer 2, and a semiconductor layer 14. The gate oxide film GX and the gate electrode GT of a MOS transistor are formed on the SOI substrate SB. The gate electrode GT and the semiconductor layer 14 are each connected to the wiring layer 8 through the via hole 5.

The MOS transistor includes a source region SR, a drain region DR, the gate oxide film GX, and the electrode GT which are selectively formed in the semiconductor layer 14. The semiconductor layer 14 provided between the source region SR and the drain region DR serves as a body region which is connected to a body potential setting region BC through a semiconductor layer under the isolation insulation layer PT of the partial isolation region (semiconductor region under the isolation insulation film).

The isolation structure of the semiconductor device is the hybrid trench isolation structure (hybrid STI: HTI) including the full isolation region (structure) and the partial isolation region (structure). In the full isolation region, the isolation insulation layer FT including a material such as $SiO_2$ is formed so as to reach the BOX layer 2, so that a full insulation structure is provided. Meanwhile, in the partial isolation region, the isolation insulation layer PT is formed so as not to reach the BOX layer 2, and the conductive semiconductor layer 14 remains between the BOX layer 2 and the isolation insulation layer PT, so that a partial insulation structure is provided. The isolation insulation layers FT and PT are produced by a method such as a LOCOS method.

FIG. 2B shows a variation of the semiconductor device according to the first embodiment, and this variation is entirely represented by 101. In FIG. 2B, the same reference as that in FIG. 1 shows the same or corresponding part, and A represents a partial isolation region, and B represents a full isolation region. A semiconductor device 101 has the hybrid trench isolation (HTI) structure including the full isolation and the partial isolation. That is, the partial isolation region A and the full isolation region B are combined between the semiconductor elements 3. Meanwhile, the TSV 6 is surrounded by the full isolation region B.

The hybrid trench isolation structure has an effect of preventing a substrate floating effect, and an effect of reducing parasitic capacitance. Since the parasitic capacitance has to be reduced in the TSV also, an adjacent part of the TSV is previously isolated by the full isolation structure, so that the TSV is surrounded by the insulation layer, and the parasitic capacitance can be reduced.

FIG. 2C is a view showing the multilayer wiring structure of the semiconductor device 100, in which FIG. 2C(a) is a schematic view showing a connection state of the laminated layers M1, M2, and M3, and FIG. 2C(b) is a cross-sectional view of the semiconductor device 100. Four blocks of FPGAs are formed in each of the layers M1 and M2, and the I/O circuits are formed in the layer M3. The TSV connects the FPGAs of the layers M1 to the FPGAs of the layer M2, and the FPGAs of the layer M2 to the I/O circuits of the layer M3.

In the above multilayer structure (three-dimensional structure), a wiring distance can be short, so that delay can be prevented from being caused due to a long distance wiring generated in a two-dimensional structure, and as a result, high speed and low power consumption can be implemented.

Figure 3:
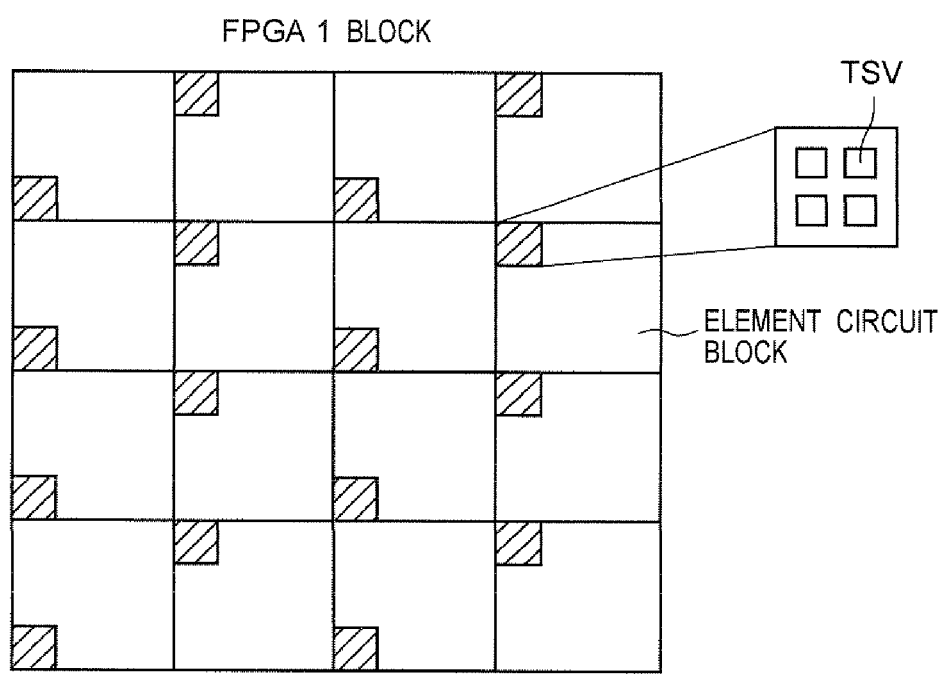
FIG. 3 is an arrangement view of TSVs and element circuit blocks in a block FPGA.

FIG. 3 shows as arrangement of the TSVs and element circuit blocks in the block FPGA 1. For example, the one FPGA includes 16 sub-blocks, and the TSVs (four in this case) are provided in each sub-block. When the TSVs are arranged as shown in FIG. 3, a degree of freedom of the wiring layout can be improved.

Second Embodiment

Figure 4:
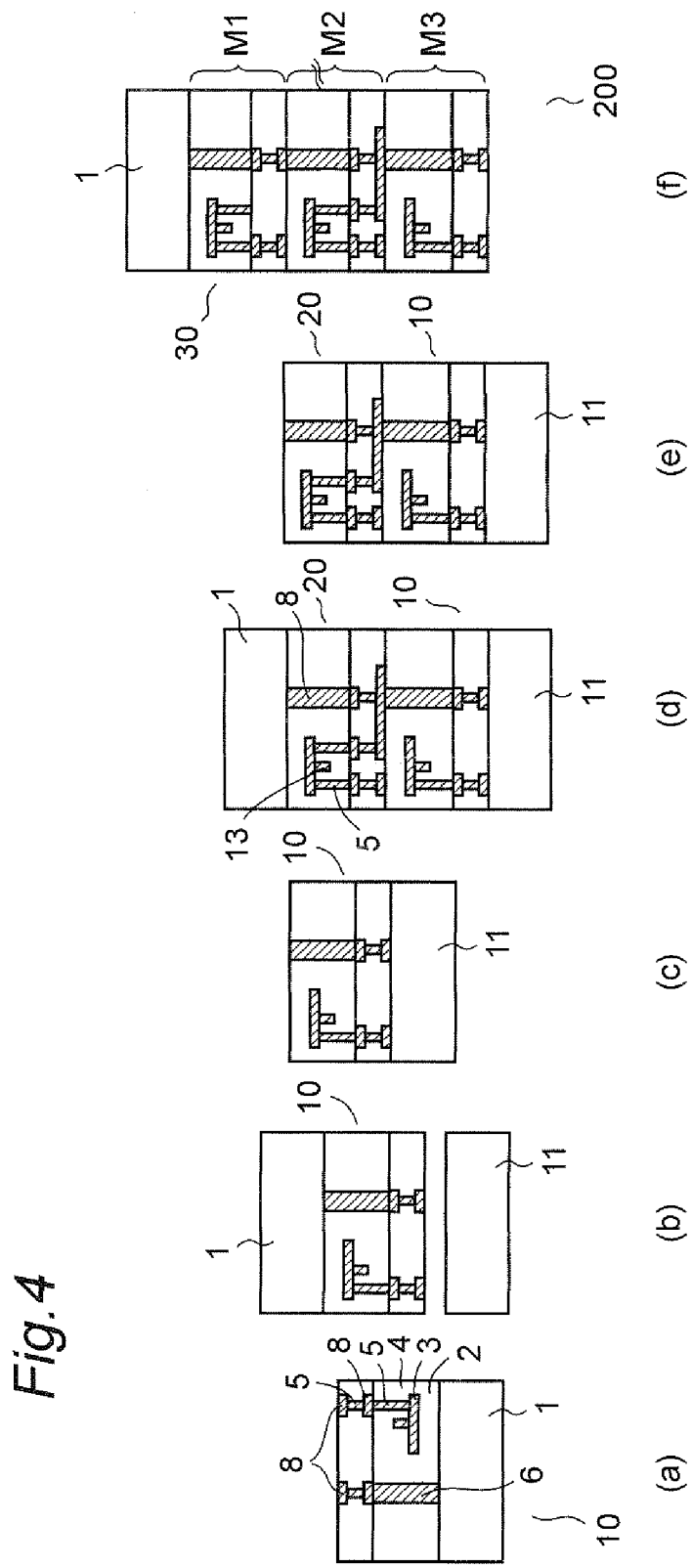
FIG. 4 is a cross-sectional view of steps of producing a semiconductor device according to a second embodiment of the present invention.

FIG. 4 is a cross-sectional view of steps of producing a semiconductor device according to a second embodiment of the present invention, and the same reference as that in FIG. 1 shows the same or corresponding part, in FIG. 4. Its production method includes the following steps 1 to 6.

Step 1: as shown in FIG. 4(a), a BOX layer (buried oxide layer) 2 is deposited on a substrate 1 such as an Si substrate, and semiconductor elements 3 configuring an I/O circuit (input/output circuit) are formed thereon, whereby a first layer 10 (normal layout) is formed. The semiconductor elements 3 are elements such as an SOI transistor and a capacitor.

Step 2: as shown in FIG. 4(b), a substrate 11 such as a Si substrate is bonded onto an upper surface of the first layer 10.

Step 3: as shown in FIG. 4(c), the substrate 1 on a lower surface of the first layer 10 is removed by a method such as a CMP method.

Step 4: as shown in FIG. 4(d), a second layer 20 (normal layout) is produced by forming semiconductor elements 13 including a logic circuit such as a FPGA, a via hole 5, and a wiring layer 8 on the substrate 1, and this layer is bonded onto the first layer 10. The semiconductor elements 13 are elements such as an SOI transistor and a capacitor.

Step 5: as shown in FIG. 4(e), the substrate 1 of the second layer 20 is removed by a method such as the CMP method.

Step 6: as shown in FIG. 4(f), a third layer 30 (normal layout) is produced by forming the semiconductor elements 13 such as the SOI transistor and the capacitor to configure the logic circuit such as the FPGA, the via hole 5, and the wiring layer 8, and this layer is bonded onto the second layer 20.

Finally, the substrate 11 on the first layer 10 is removed by a method such as the CMP method. Through the above steps, a semiconductor device (three-dimensional device) 200 having the three laminated layers M1, M2, and M3 on the substrate 1 is completed.

According to the production method in the second embodiment, although the bonding step 2 (FIG. 4(b)) is added, the semiconductor device 200 can be produced with the first layer 10, the second layer 20, and the third layer 30 each having the normal layout, so that the production steps are prevented from becoming complicated due to the mirror layout.

Third Embodiment

Figure 5:
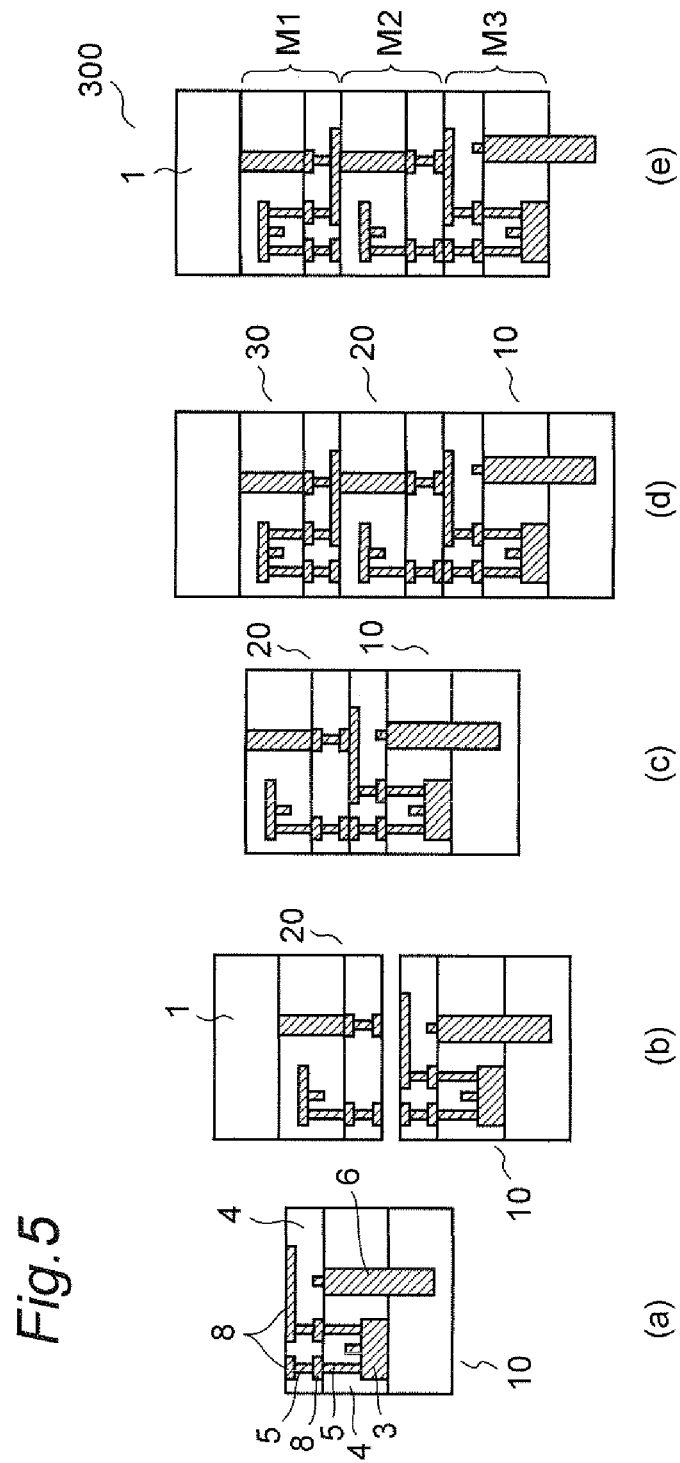
FIG. 5 is a cross-sectional view of steps of producing a semiconductor device according to a third embodiment of the present invention.

FIG. 5 is a cross-sectional view of steps of producing a semiconductor device according to a third embodiment of the present invention, and the same reference as that in FIG. 1 shows the same or corresponding part, in FIG. 5. Its production method includes the following steps 1 to 5.

Step 1: as shown in FIG. 5(a), a substrate 1 such as a Si substrate is prepared, and a transistor 3 of an I/O circuit (input/output circuit), and a TSV 6 are formed thereon. Here, the semiconductor elements 3 including a bulk transistor and a capacitor are formed on the substrate 1 without forming a BOX layer.

Steps 2 to 4: as shown in FIG. 5(b) to FIG. 5(d), steps 2 to 4 are roughly the same as the steps 2 to 4 in the first embodiment.

Step 5: as shown in FIG. 5(e), the substrate 1 of a first layer 10 is removed by a method such as a CMP method. Through the above steps, a semiconductor device (three-dimensional device) 300 having three laminated layers M1, M2, and M3 on the substrate 1 is completed.

According to the semiconductor device 300 in the third embodiment, the layers M1 and M2 formed on the substrate 1 each has the normal layout, and only the layer M3 has the mirror layout. The layer M3 has the I/O circuit (input/output circuit) in which the mirror layout is relatively easy to be produced, so that the production steps including a step of forming a mask can be relatively easy to be performed.

Fourth Embodiment

Figure 6:
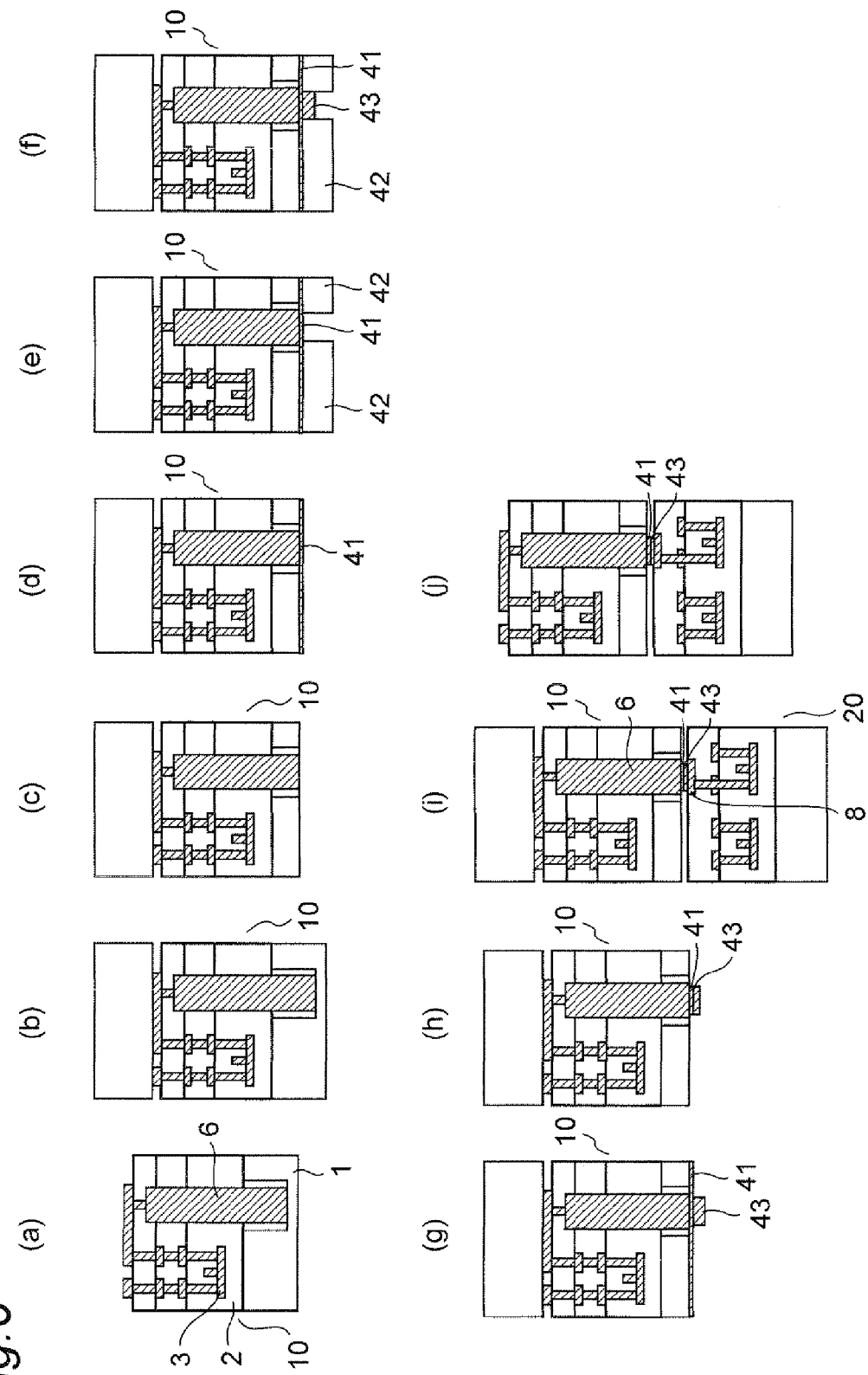
FIG. 6 is a cross-sectional view of steps of producing a semiconductor device according to a fourth embodiment of the present invention.

FIG. 6 shows a step of producing a semiconductor device according to a fourth embodiment, and the same reference as that in FIG. 1 shows the same or corresponding part.

By the production steps, a first layer 10 and a second layer 20 are bonded, and the first layer 10 serves as an uppermost layer. Bonding steps in the fourth embodiment include the following steps 1 to 10.

Step 1: as shown in FIG. 6(a), the first layer 10 is formed. A TSV 6 is formed so as to be embedded in a substrate 1. Semiconductor elements 3 including an SOI transistor and a capacitor are formed on a BOX layer 2.

Step 2: as shown in FIG. 6(b), a support substrate 11 is bonded onto an upper surface of the first layer 10.

Step 3: as shown in FIG. 6(c), the substrate 1 is etched from its lower surface by a method such as a CMP method. At this time, the TSV 6 serves as an etching stopper.

Step 4: as shown in FIG. 6(d), a seed layer 41 is formed on a lower surface of the first layer 10 by a method such as a sputtering method. The seed layer 41 includes a layer such as a Ti/TiN layer.

Step 5: as shown in FIG. 6(e), a resist mask 42 is formed on the seed layer 41. The resist mask 42 has an opening part positioned above the TSV 6.

Step 6: as shown in FIG. 6(f), a bump 43 is selectively formed on the seed layer 41 in the opening part by a method such as a plating method. The bump 43 is made of a material such as Sn, In, Ni, Au, or Cu, or Cu/Ni/In.

Step 7: as shown in FIG. 6(g), the rest mask 42 is removed.

Step 8: as shown in FIG. 6(h), the seed layer 41 is etched away using the bump 43 as an etching mask. As a result, the bump 43 is selectively formed on the TSV 6.

Step 9: as shown in FIG. 6(i), the first layer 10 is bonded onto the second layer 20 using the bump 43 in such a manner that a wiring layer of the second layer 20 is connected to the TSV 6 of the first layer 10.

Figure 7:
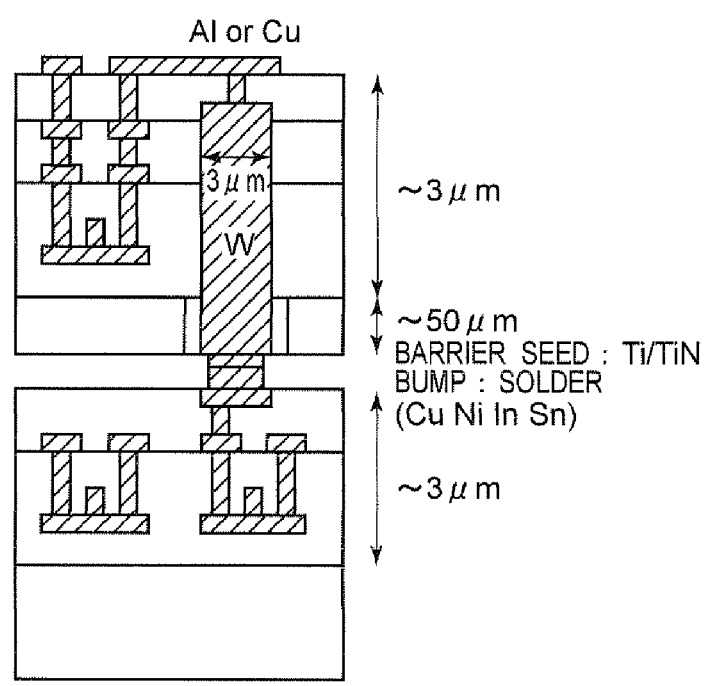
FIG. 7 is a cross-sectional view of the semiconductor device according to the fourth embodiment of the present invention.

Step 10: as shown in FIG. 6(j), the substrate 11 is removed. Through the above steps, the semiconductor device in which the first layer 10 serving as the uppermost layer is laminated on the second layer 20 is completed as shown in FIG. 7.

According to the production method in the fourth embodiment, since the substrate 1 of the first layer 10 is etched in the step 3 using the TSV 6 as the etching stopper, a film thickness of the substrate 1 after the etching operation can be correctly controlled. Especially, since the TSV 6 is embedded in the substrate 1 to reach a depth of about 200 µm, the substrate 1 can be prevented from being split because the substrate 1 is thinned too much. As a result, a production yield can be improved.

In addition, since the first layer 10 is bonded to the second layer 20 with the bump 43 formed of a solder material, the bonding can be performed at low temperature such as 200° C. or less.

Figure 8:
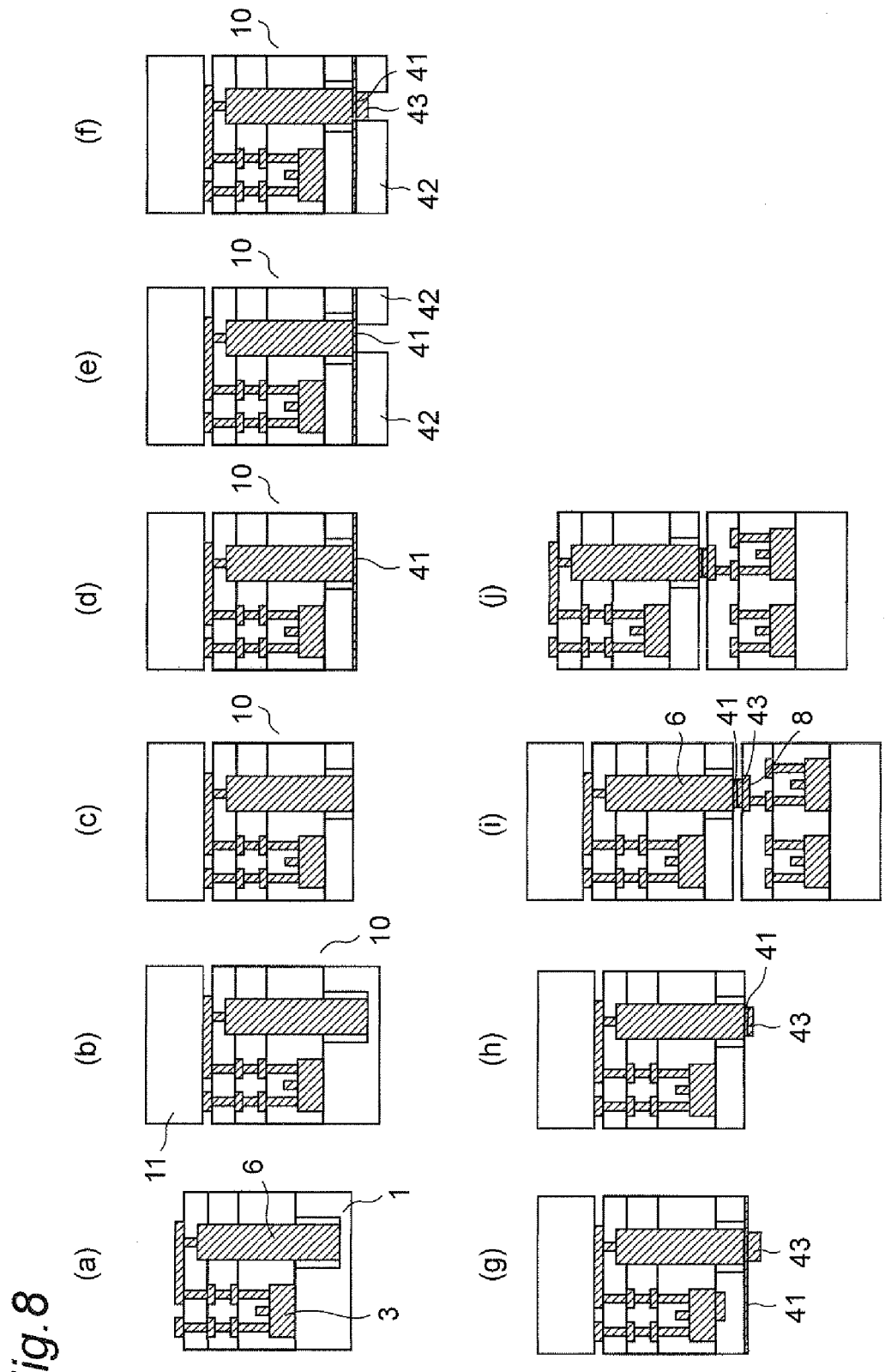
FIG. 8 is a cross-sectional view of steps of producing another semiconductor device according to the fourth embodiment of the present invention.

FIG. 8 shows steps of producing another semiconductor device according to the fourth embodiment, and the same reference as that in FIG. 6 shows the same or corresponding part. While a bulk transistor is used instead of the SOI transistor having the SOI structure as the semiconductor element 3 in FIG. 8, the others are the same as those in FIG. 6.

Thus, the production steps according to the fourth embodiment can be applied to both of the SOI transistor and the bulk transistor.

Fifth Embodiment

Figure 9:
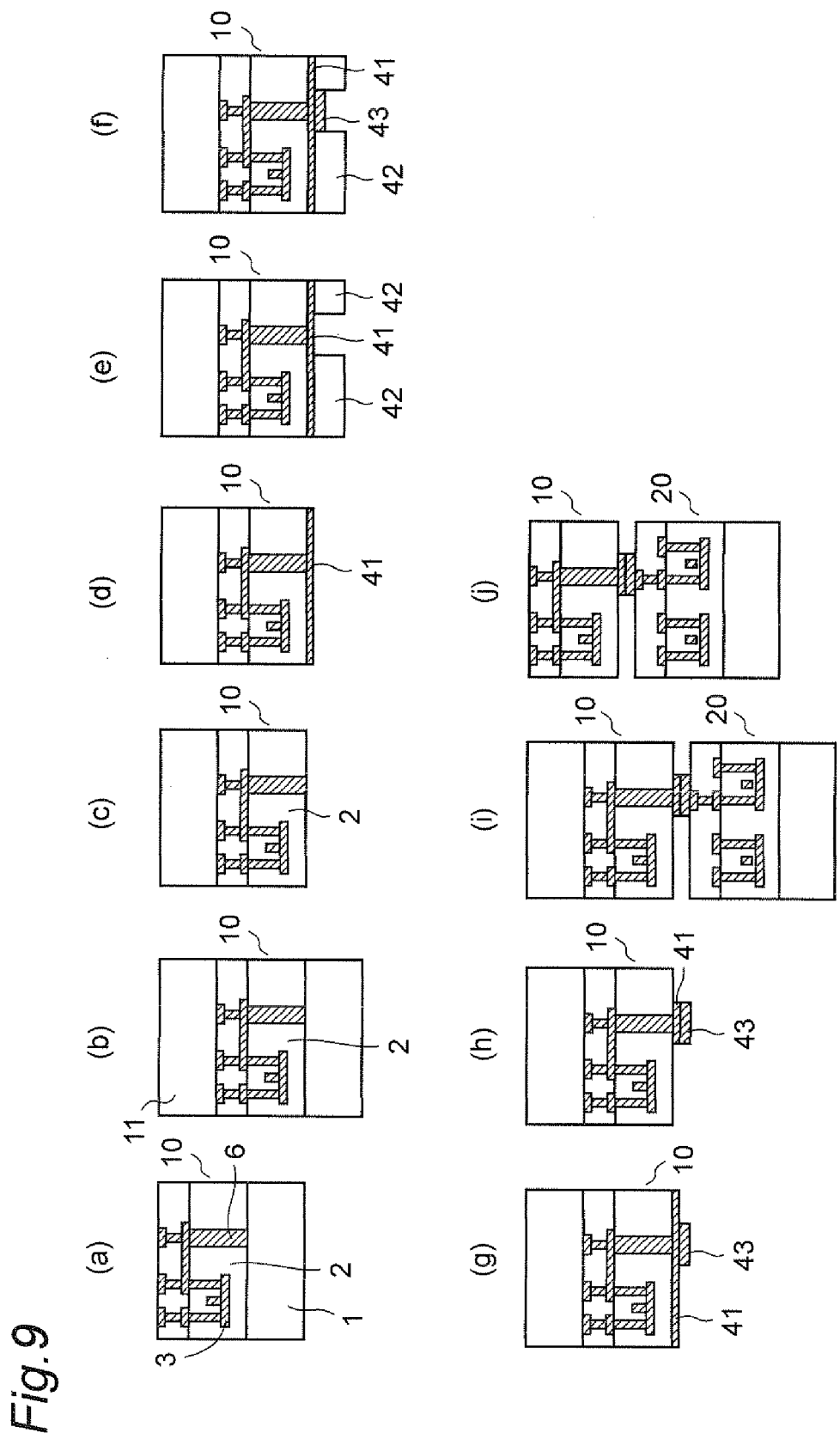
FIG. 9 is a cross-sectional view of steps of producing a semiconductor device according to a fifth embodiment of the present invention.

FIG. 9 shows steps of producing a semiconductor device according to a fifth embodiment, and the same reference as that in FIG. 1 shows the same or corresponding part.

While the production steps include the following steps 1 to 10, they are the same as those in the fourth embodiment except that a substrate 1 of a first layer 10 is wholly removed.

Step 1: as shown in FIG. 9(a), the first layer 10 is formed. A TSV 6 is formed so as to be embedded in the substrate 1. Semiconductor elements 3 such as an SOI transistor, and capacitance are formed on a BOX layer 2.

Step 2: as shown in FIG. 9(b), a support substrate 11 is bonded onto an upper surface of the first layer 10.

Step 3: as shown in FIG. 9(c), the substrate 1 is etched from its lower surface by a method such as a CMP method and removed completely and the BOX layer 2 is exposed. At this time, the TSV 6 serves as an etching stopper.

Figure 10:
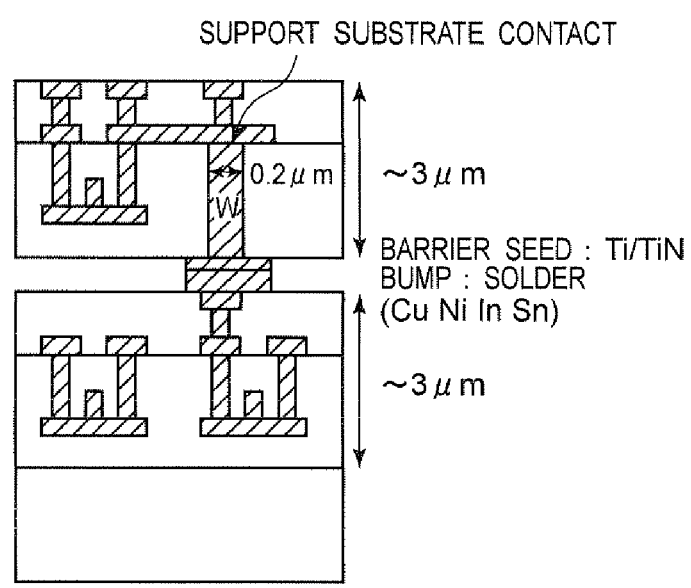
FIG. 10 is a cross-sectional view of the semiconductor device according to the fifth embodiment of the present invention.

Steps 4 to 10: as shown in FIG. 9(d) to FIG. 9(j), the same steps as those in the steps 4 to 10 in the fourth embodiment are performed, whereby the semiconductor device is completed as shown in FIG. 10.

According to the production method in the fifth embodiment, since the substrate 1 of the first layer 10 is etched away in the step 3 using the TSV 6 as the etching stopper, the precise etching can be performed.

In addition, since the first layer 10 and a second layer 20 are bonded by use of a bump 43 formed of a solder material, the bonding can be performed at a low temperature such as 200° C. or less. Therefore, device characteristics can be prevented from deteriorating due to a heat history, which is advantageous in producing a multilayer structure.

Sixth Embodiment

Figure 11:
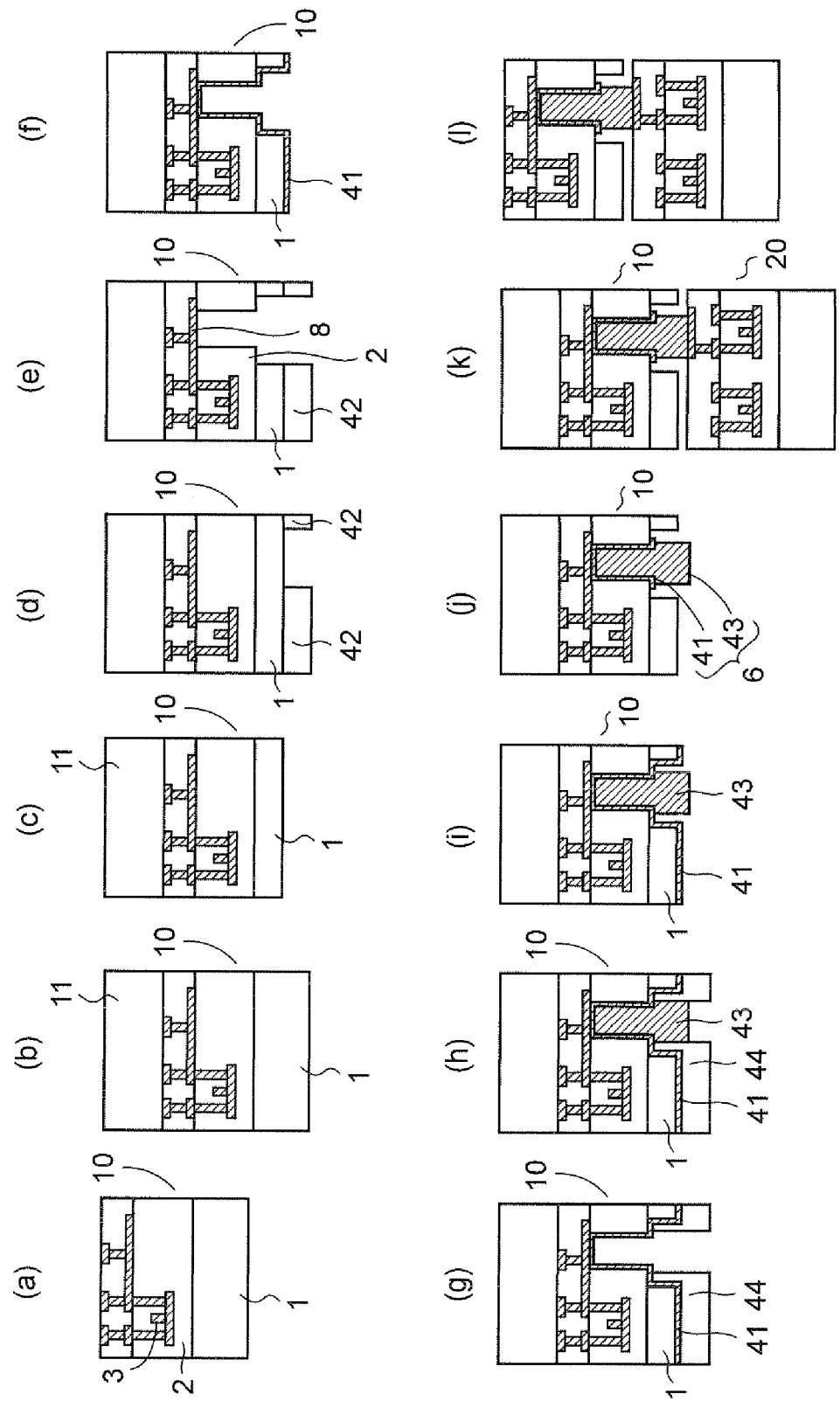
FIG. 11 is a cross-sectional view of steps of producing a semiconductor device according to a sixth embodiment of the present invention.

FIG. 11 shows steps of producing a semiconductor device according to a sixth embodiment, and the same reference as that in FIG. 1 shows the same or corresponding part.

By the production steps including the following steps 1 to 11, semiconductor elements 3 are produced, and then a TSV 6 is formed in a first layer from a lower surface.

Step 1: as shown in FIG. 11(a), a first layer 10 is formed. Semiconductor elements 3 such as an SOI transistor, and a capacitor are formed on a BOX layer 2.

Step 2: as shown in FIG. 11(b), a support substrate 11 is bonded onto an upper layer of the first layer 10.

Step 3: as shown in FIG. 11(c), a substrate 1 is etched from its lower surface by a method such as a CMP method to reduce its film thickness.

Step 4: as shown in FIG. 11(d), a resist mask 42 is formed on a lower surface of the first layer 10.

Step 5: as shown in FIG. 11(e), the substrate 1 and the BOX layer 2 are etched using the resist mask 42 as an etching mask to expose a wiring layer 8.

Step 6: as shown in FIG. 11(f), a seed layer 41 is formed in an opening part. The seed layer 41 is made of a material such as Ti/TiN.

Step 7: as shown in FIG. 11(g), a resist mask 44 is formed on the seed layer 41.

Step 8: as shown in FIG. 11(h), a bump 43 is selectively formed on the seed layer 41 in the opening part by a method such as a plating method. The bump 43 is made of a material such as Sn, In, Ni, Au, or Cu or Cu/Ni/In.

Step 9: as shown in FIG. 11(i), the resist mask 44 is removed.

Step 10: as shown in FIG. 11(j), the seed layer 41 is etched away using the bump 43 as an etching mask. As a result, the TSV 6 including the seed layer 41 and the bump 43 is formed.

Step 11: as shown in FIG. 11(k), the first layer 10 is bonded onto a second layer 20 with the bump 43 in such a manner that a wiring layer of the second layer 20 is connected to the TSV 6 of the first layer 10.

Figure 12:
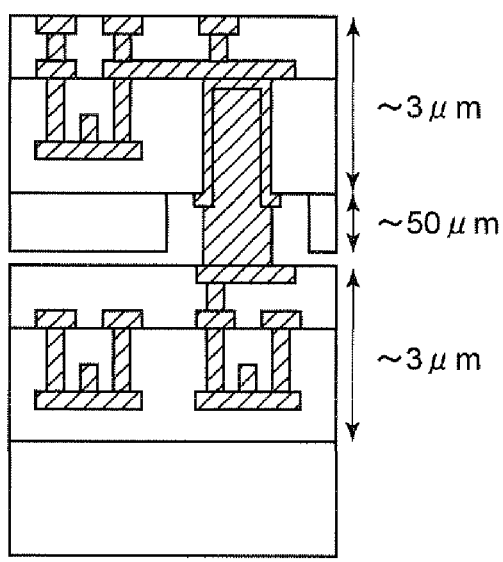
FIG. 12 is a cross-sectional view of the semiconductor device according to the sixth embodiment of the present invention.

Step 12: as shown in FIG. 11(l), the substrate 11 is removed. Through the above steps, the semiconductor device in which the first layer 10 serving as the uppermost layer is laminated on the second layer 20, as shown in FIG. 12.

In the steps of producing the semiconductor device in the sixth embodiment, since after the semiconductor elements 3 have been formed, the TSV 6 is formed from the lower surface, so that the semiconductor elements such as the SOI transistor can be prevented from being damaged in the step of forming the TSV 6, and a yield can be improved.

Note that the production steps in the sixth embodiment can be applied to not only the SOI transistor having the SOI structure but also a bulk transistor.

Seventh Embodiment

Figure 13:
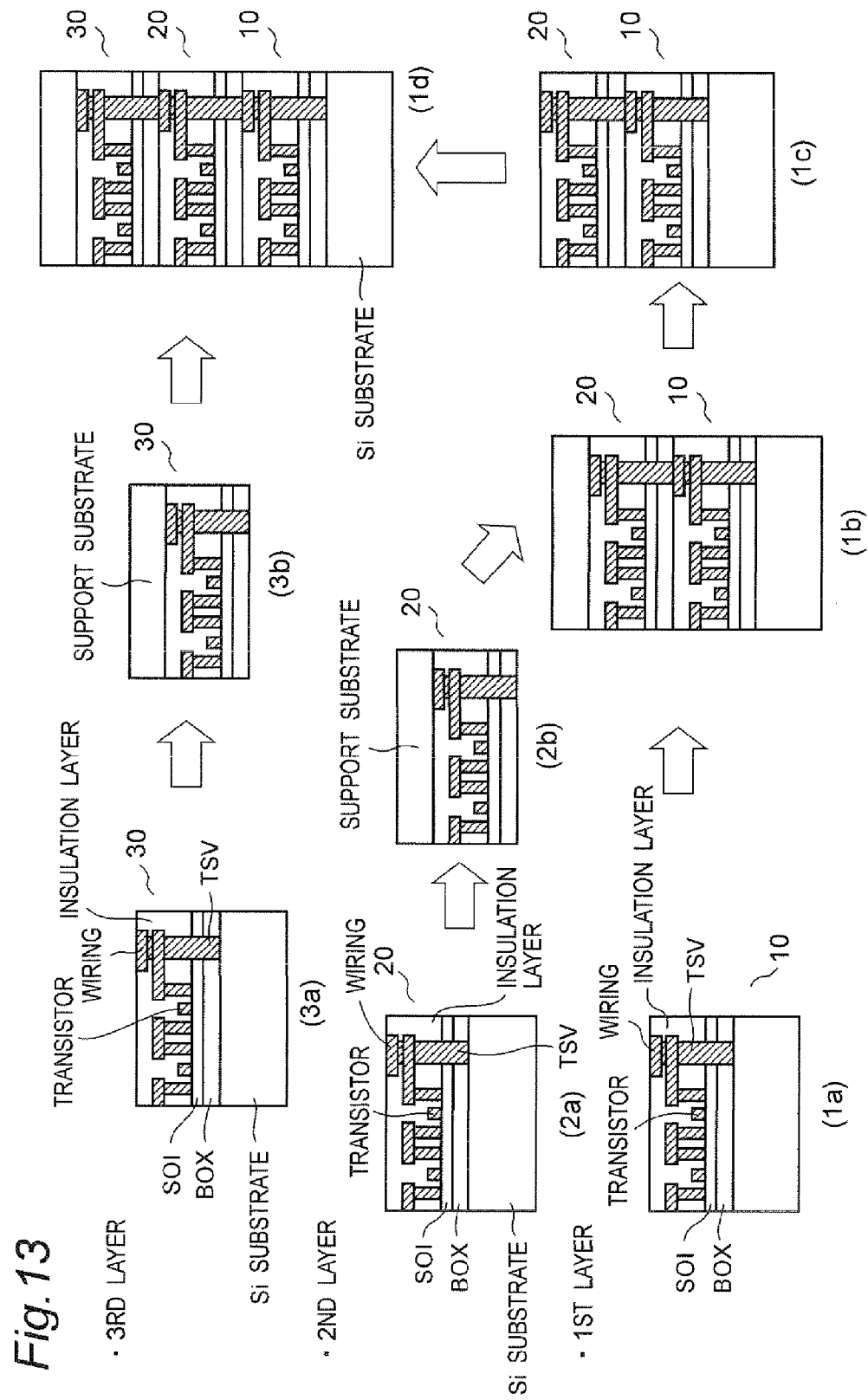
FIG. 13 is a cross-sectional view of steps of producing a semiconductor device according to a seventh embodiment of the present invention.

FIG. 13 is a cross-sectional view of steps of producing a semiconductor device according to a seventh embodiment. While a description will be made of a semiconductor device having a three-layer structure in this seventh embodiment, this embodiment can be applied to a semiconductor device having a two-layer, or four-layer or more-layer structure.

As shown in FIG. 13(1a), a first layer 10 is formed. The first layer 10 is formed in such a manner that a BOX layer, and an SOI layer are sequentially laminated on a Si substrate, and a transistor such as a CMOS is formed thereon (FEOL: Front End of Line).

After the FEOL, an insulation layer is formed and etched to provide an opening part, and a TSV is formed therein. Finally, a wiring is formed (BEOL: Back End of Line).

As shown in FIG. 13(2a), a second layer 20 is formed in the same manner as the first layer 10.

As shown in FIG. 13(2b), a support substrate is bonded to an upper surface of the second layer 20, and the Si substrate is etched from a lower surface thereof to be removed. The TSV is exposed to the lower surface of the second layer 20.

As shown in FIG. 13(1b), the second layer 20 is bonded onto the first layer 10. Thus, the TSV of the first layer 10 is electrically connected to the TSV of the second layer.

As shown in FIG. 13(1c), the support substrate on the second layer 20 is removed by a method such as etching.

As shown in FIG. 13(3a), a third layer 30 is formed in the same manner as the first layer 10.

As shown in FIG. 13(3b), the support substrate is bonded onto an upper surface of the third layer, and the Si substrate is etched from a lower layer thereof to be removed. The TSV is exposed to the lower surface of the third layer 30.

As shown in FIG. 13(1d), the third layer 30 is bonded to an upper surface of a laminated structure of the first layer 10 and the second layer 20. Thus, the TSVs of the first layer 10, the second layer 20, and the third layer 30 are electrically connected to each other. Then, the support substrate on the upper surface is removed by etching, and a required wiring is formed, whereby the semiconductor device having the laminated structure is completed.

According to the production method in the seventh embodiment, the TSV is formed between the step of forming the transistor (FEOL) and the step of forming the wiring (BEOL) in each layer. Thus, the TSV of the first layer can be formed without being subjected to the restriction of a wiring layout of the second layer.

In addition, since the TSV can be formed by the wiring step such as the damascene process, the TSV can be formed in a usual LSI production line.

In addition, since the Si substrate is etched with respect to each layer, damage due to the etching can be small, so that a yield of the semiconductor device can be improved.

Furthermore, the production steps in the seventh embodiment can be applied to the other embodiments of the present invention and a conventional production method.

Eighth Embodiment

Figure 14:
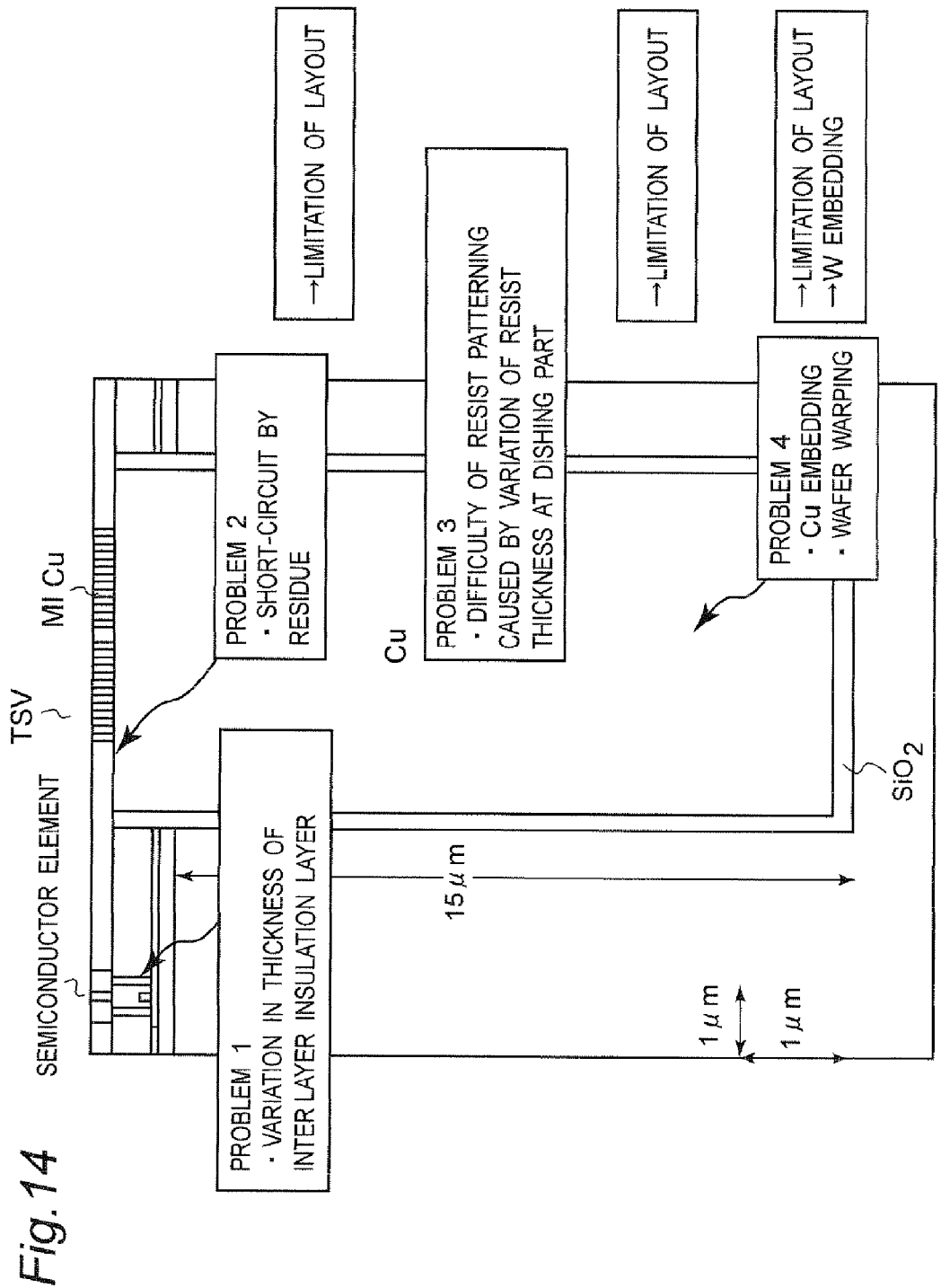
FIG. 14 is a schematic view of a semiconductor device having semiconductor elements and a Cu-TSV according to an eighth embodiment of the present invention.

FIG. 14 is a schematic view of a semiconductor device including a semiconductor element (transistor) and a TSV (width is 5 µm and depth is 15 µm) including Cu, and shows the problems 1 to 4 caused in the above semiconductor device.

The problem 1 is that transistor characteristics vary due to a variation in film thickness of an interlayer insulation layer. That is, the variation in film thickness of the interlayer insulation layer provided between the transistor and a wiring layer causes a variation in length of a via hole (vertical wiring) to connect the transistor and the wiring layer.

Figure 15:
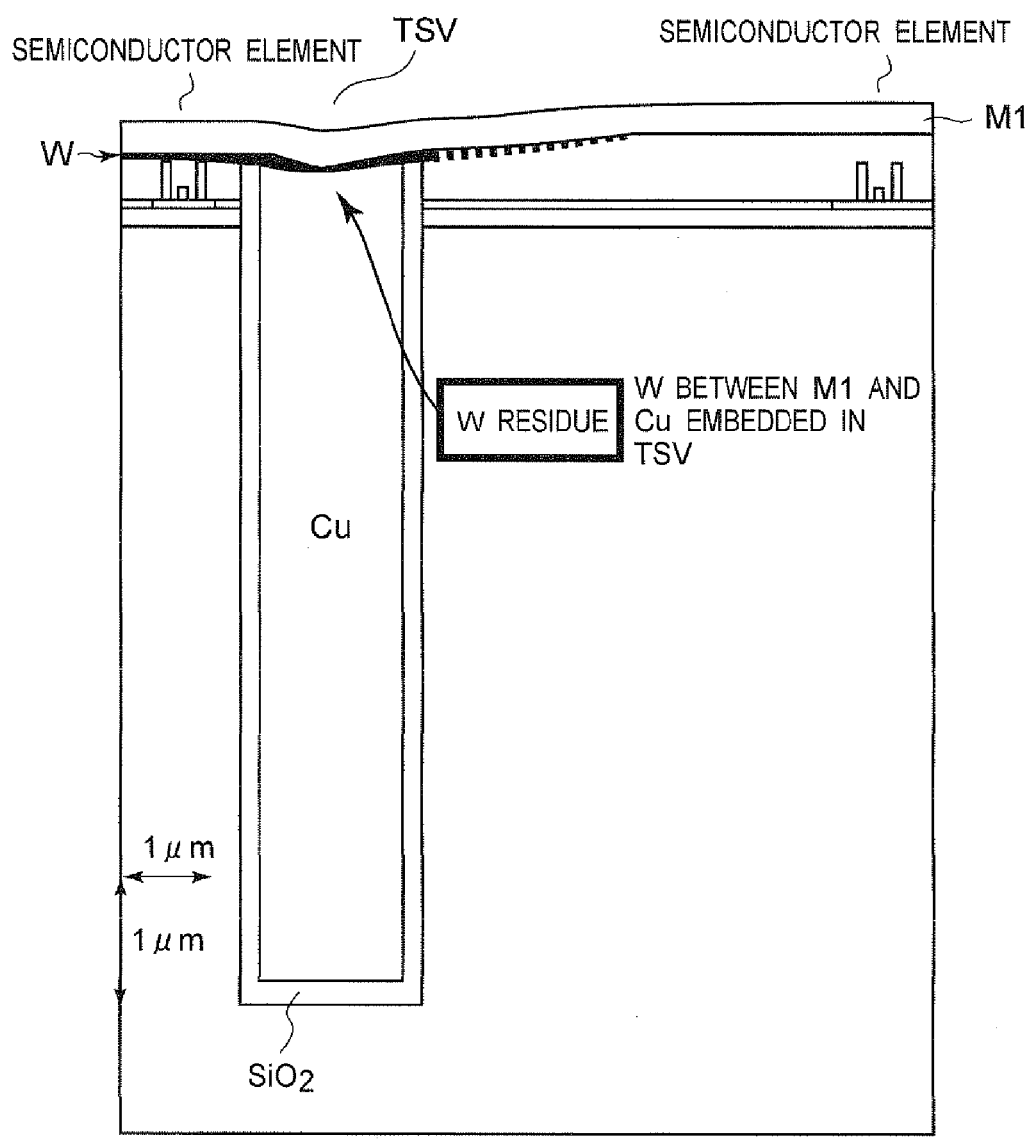
FIG. 15 is a schematic view of the semiconductor device having the semiconductor elements and the Cu-TSV according to the eighth embodiment of the present invention.

The problem 2 is that after the TSV embedded with Cu has been formed, in a step of depositing and etching W to form the via hole embedded with W, electrical short-circuit is generated due to a residue of etched W. That is, as shown in FIG. 15, when W deposited to form the via hole of the semiconductor element (transistor) remains on the interlayer insulation layer even after being etched, the short-circuit is caused between the via hole and the TSV.

Figure 16:
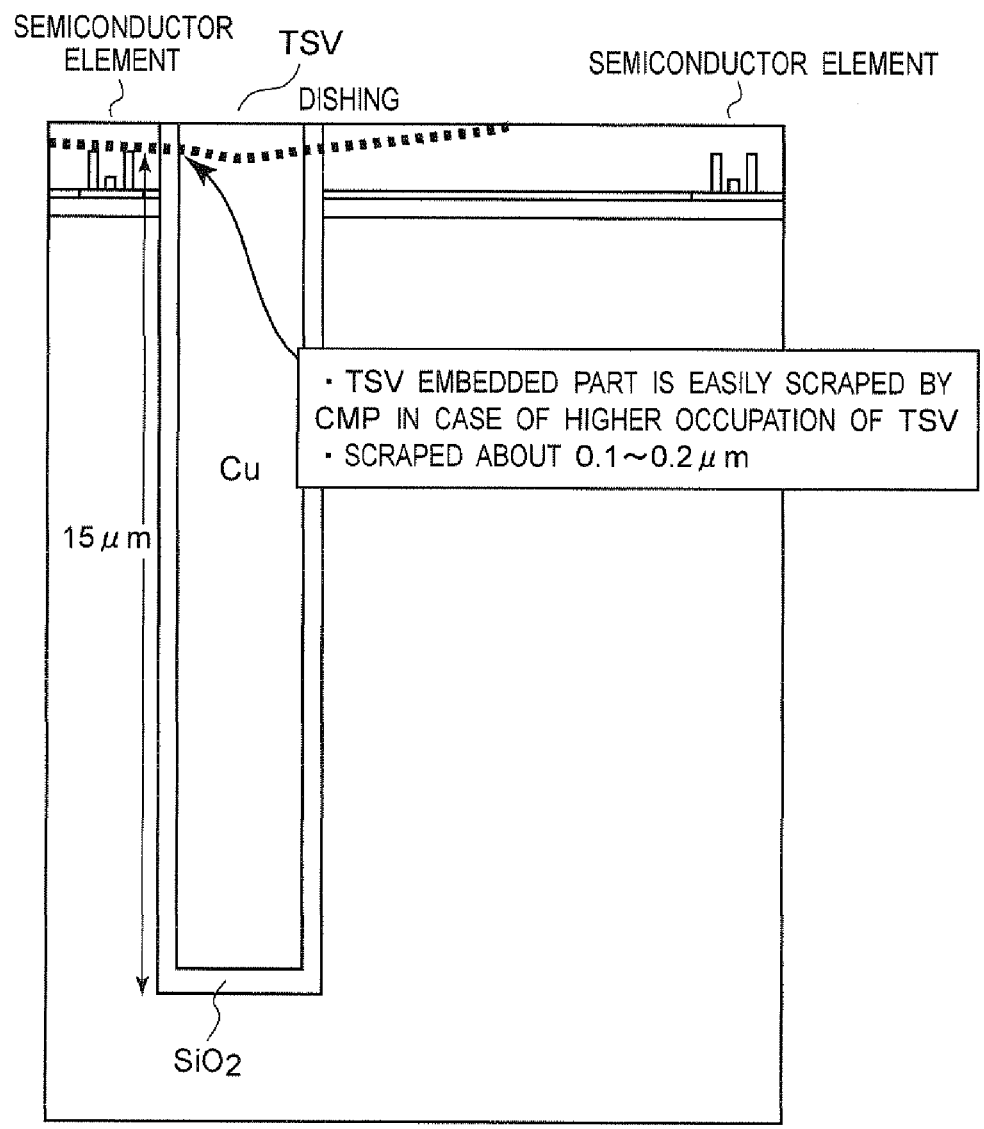
FIG. 16 is a schematic view of the semiconductor device having the semiconductor elements and the Cu-TSV according to the eighth embodiment of the present invention.

The problem 3 is that, as shown in FIG. 16, the interlayer insulation layer is scraped in the vicinity of an opening part due to polishing (CMP) of Cu to form the TSV, that is, dishing is formed. More specifically, an embedded part of the TSV is likely to be scraped (0.1 to 0.2 µm in depth direction) in the polishing step, and especially, as TSV occupancy becomes high (as area of the TSV increases), the dishing becomes pronounced. Due to this dishing, a resist layer cannot become flat in a step of forming a resist mask on the interlayer insulation layer, so that it is difficult to finely pattern the resist.

The problem 4 is that a wafer is warped when Cu is embedded to form the TSV. That is, the wafer is warped due to a difference in thermal expansion coefficients between Cu of the TSV and Si of the substrate.

According to the eighth embodiment, the problems 1 to 4 are solved by controlling a layout in such a manner that a distance between the semiconductor element and the TSV is set to be large, and the semiconductor element such as the transistor is not formed in the vicinity of the TSV.

Especially, as for the problem 4 (wafer warpage), the wafer is prevented from being warped by using W having a thermal expansion coefficient which is (small) closer to that of Si than that of Cu, as a material embedded in the TSV. When W is used as the TSV material, it is preferable that a distance between the TSV and the semiconductor element is set to be more than 20 µm, and a distance between the TSV and the TSV is set to be more than several µm.

In addition, as for the problem 1 (lithography defect) and the problem 3 (dishing), when W is used as the TSV material, it is preferable that the distance between the TSV and the semiconductor element is set to be more than 10 µm, and the distance between the TSV and the TSV is set to be more than 10 µm.

Figure 17:
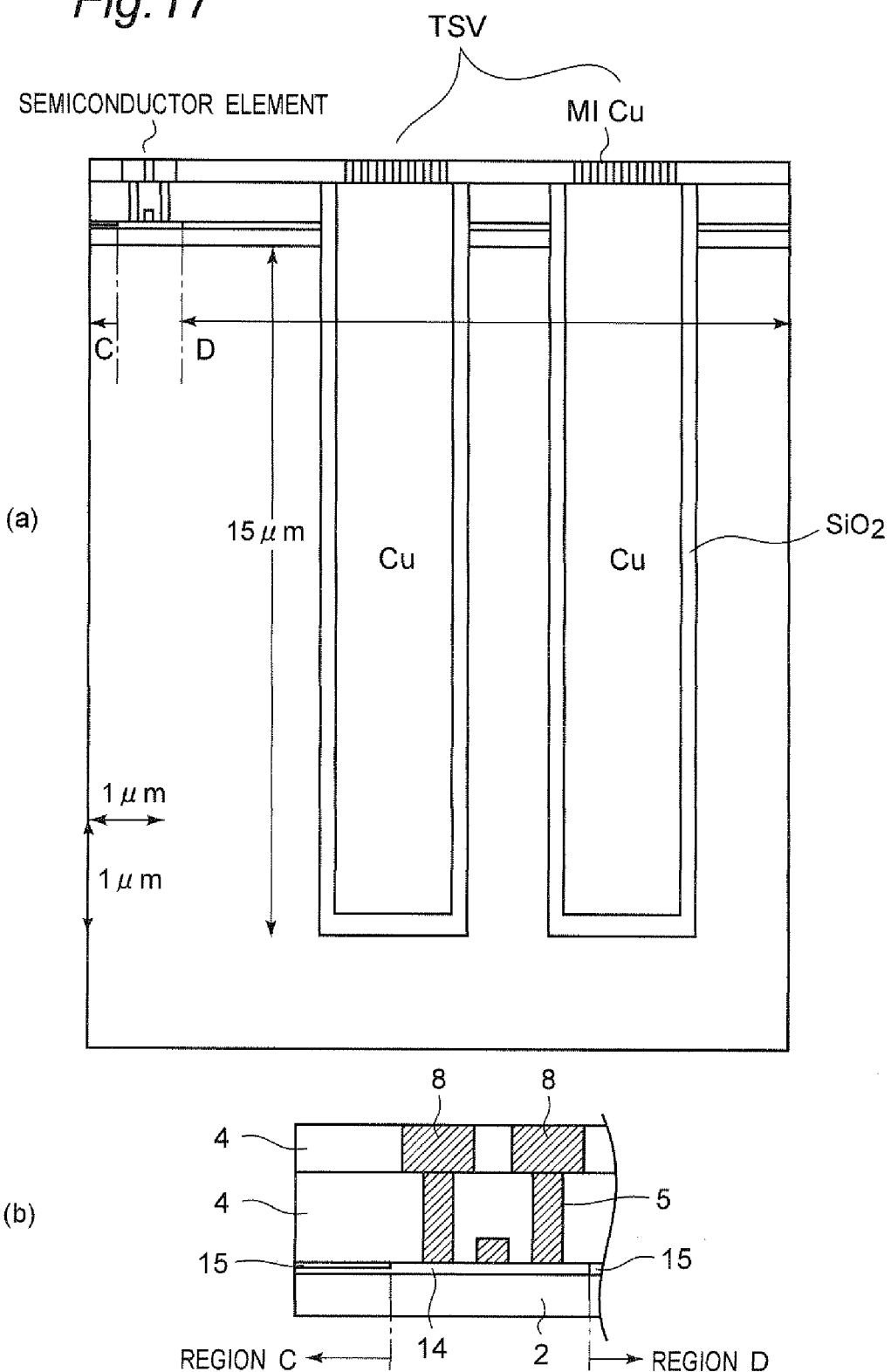
FIG. 17 is a schematic view of a semiconductor device having the semiconductor elements and two W-TSVs according to the eighth embodiment of the present invention.

As shown in FIG. 17(a) and FIG. 17(b), instead of using the one TSV (width is 5 µm) embedded with Cu, two TSVs (width is 2 µm and distance is 1 µm) embedded with W may be used. A region C between the semiconductor elements such as a transistor and a capacitor is isolated by a partial isolation structure A, and a region D of the TSV is isolated by a full isolation structure B. Note that the region C may be isolated by the full isolation structure B or the hybrid isolation structure.

FIG. 17(b) is an enlarged cross-sectional view showing a periphery of the semiconductor elements shown in FIG. 17(a). The region C has the partial isolation structure in which an isolation insulation layer 15 does not reach a BOX layer 2, and a conductive semiconductor layer 14 remains therebetween. Meanwhile, the region D has the full insulation structure in which the isolation insulation layer 15 reaches the BOX layer 2. Note that the region C may be isolated by the full isolation structure B or the hybrid isolation structure.

Ninth Embodiment

FIGS. 18 to 21 are cross-sectional views of steps of producing a semiconductor device according to a ninth embodiment. According to the production steps, dishing is prevented by using laminated films of SiN/$SiO_2$ as barrier film of a TSV.

Figure 18:
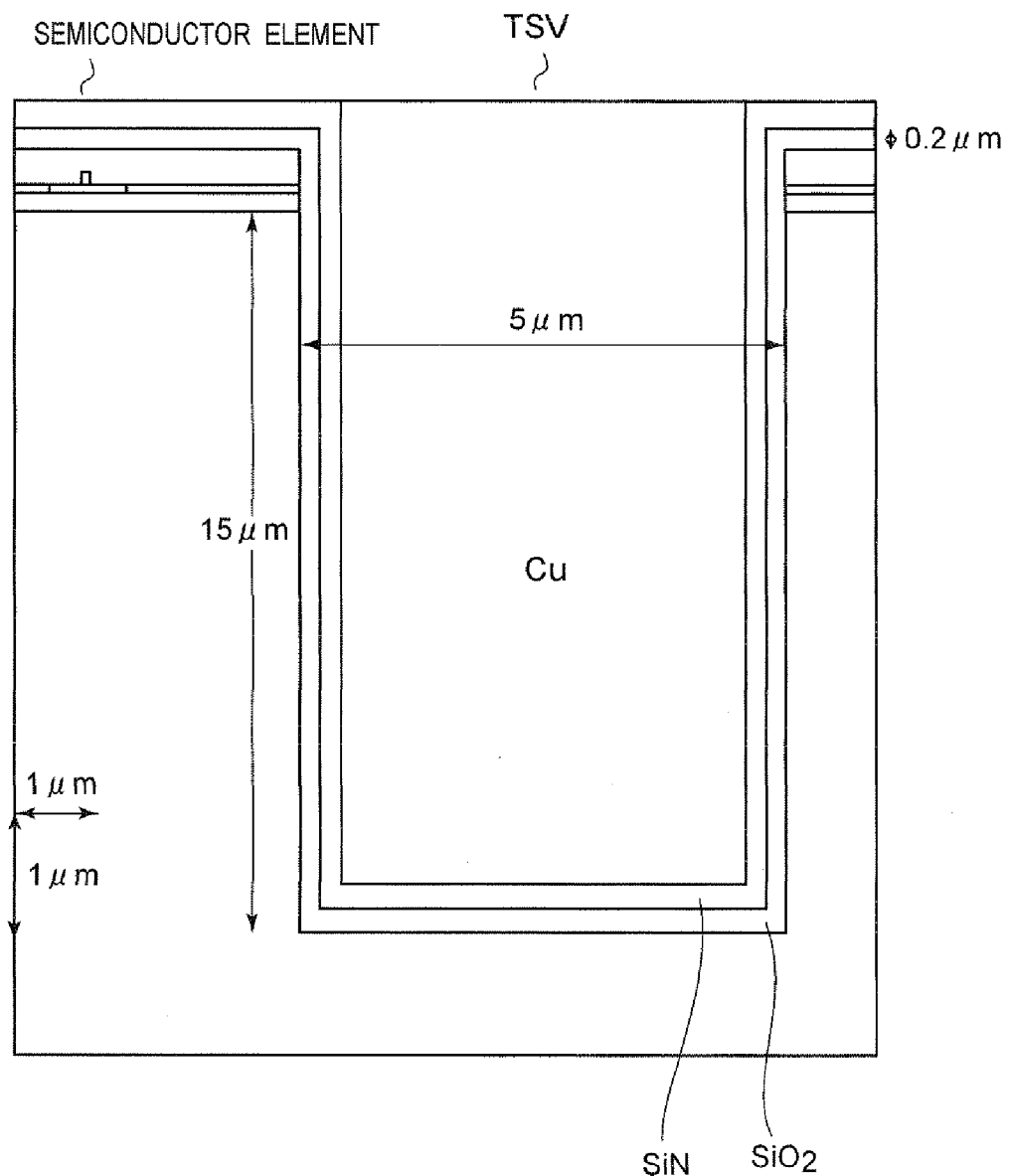
FIG. 18 is a cross-sectional view of steps of producing a semiconductor device according to a ninth embodiment of the present invention.

As shown in FIG. 18, an opening part is formed in an insulation layer on a semiconductor element, and an $SiO_2$ film and an SiN film are sequentially formed thereon by a method such as a CVD method.

Figure 19:
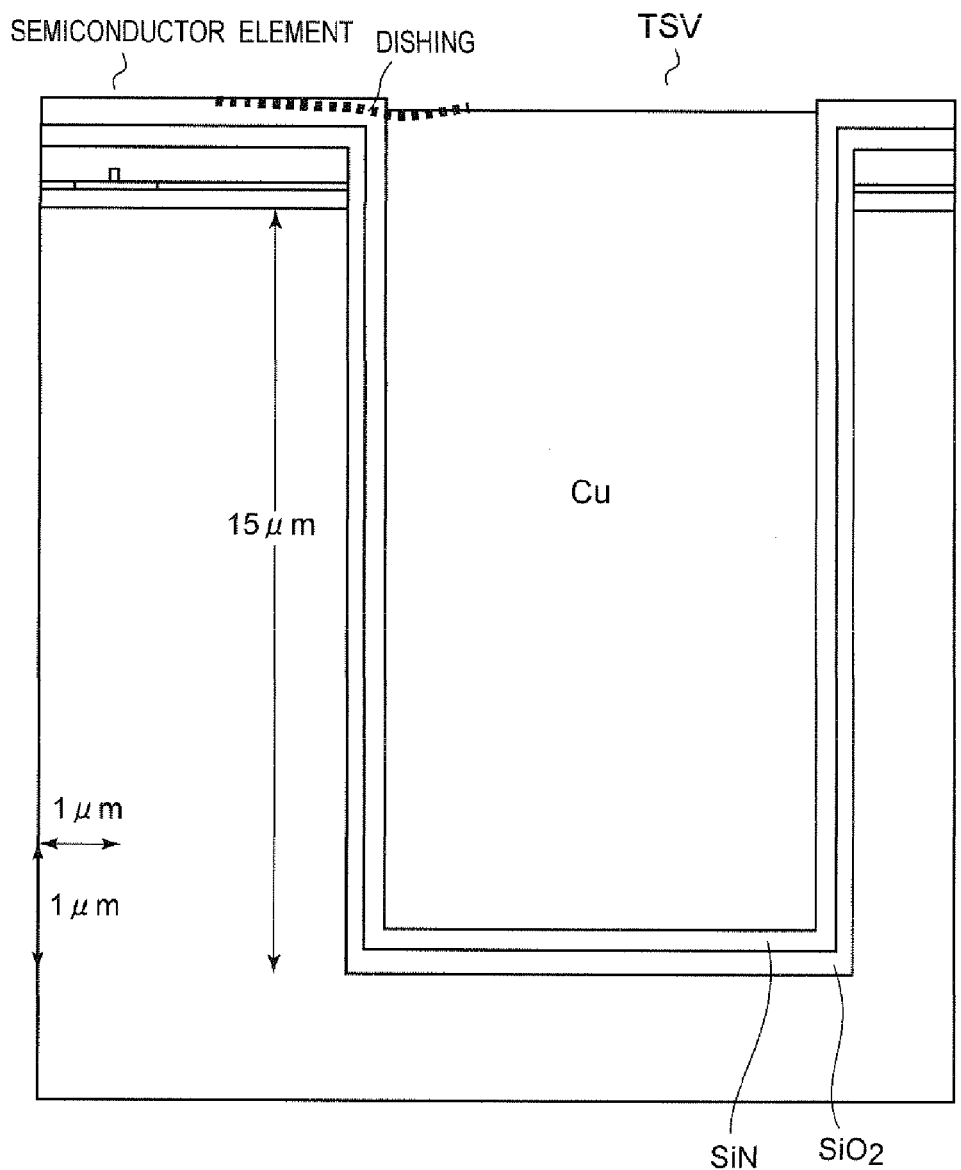
FIG. 19 is a cross-sectional view of steps of producing the semiconductor device according to the ninth embodiment of the present invention.

As shown in FIG. 19, after Cu has been deposited on the whole surface by a method such as a plating method, the material Cu is polished by a method such as a CMP method to form the TSV with Cu remaining in the opening part. The SiN film serves as an etching stopper in the CMP step. In this step, although the SiN film around the opening part is subjected to dishing, a dishing amount can be considerably reduced as compared with the case where $SiO_2$ film is used.

Figure 20:
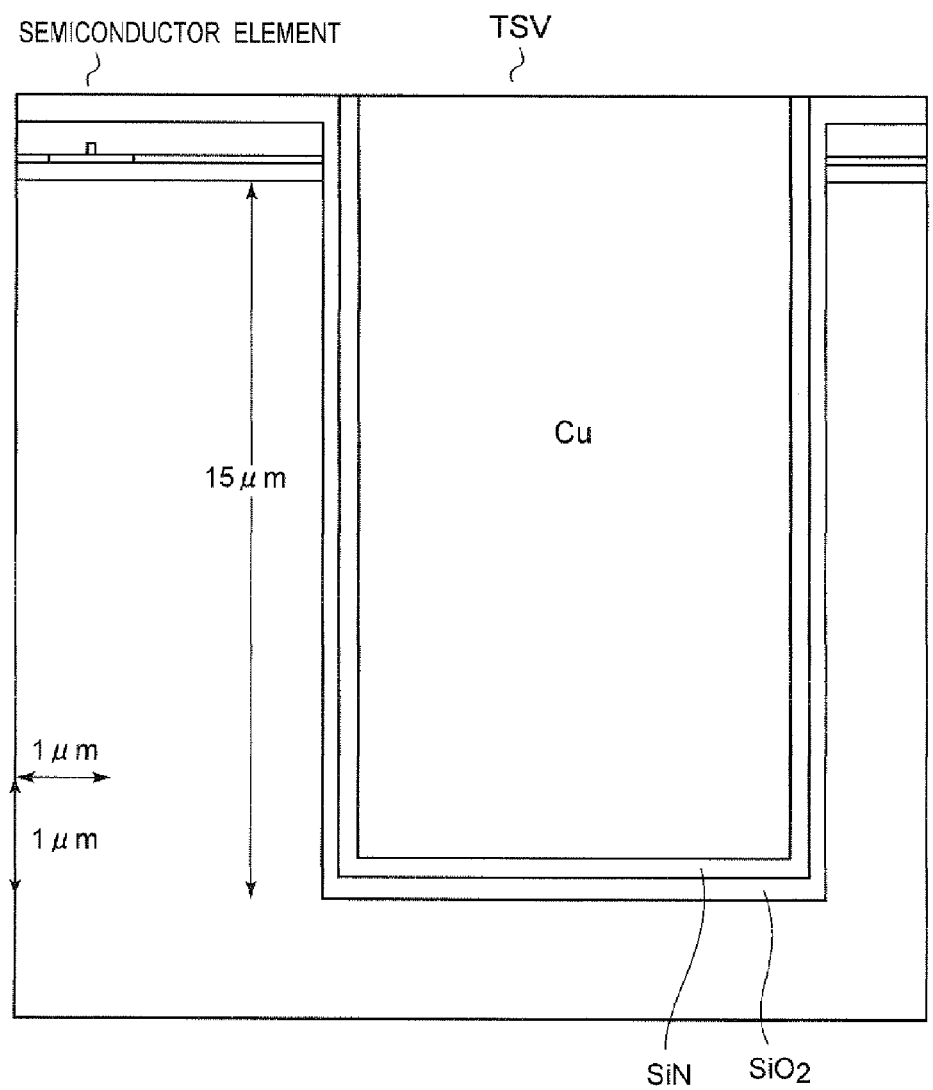
FIG. 20 is a cross-sectional view of steps of producing the semiconductor device according to the ninth embodiment of the present invention.
Figure 21:
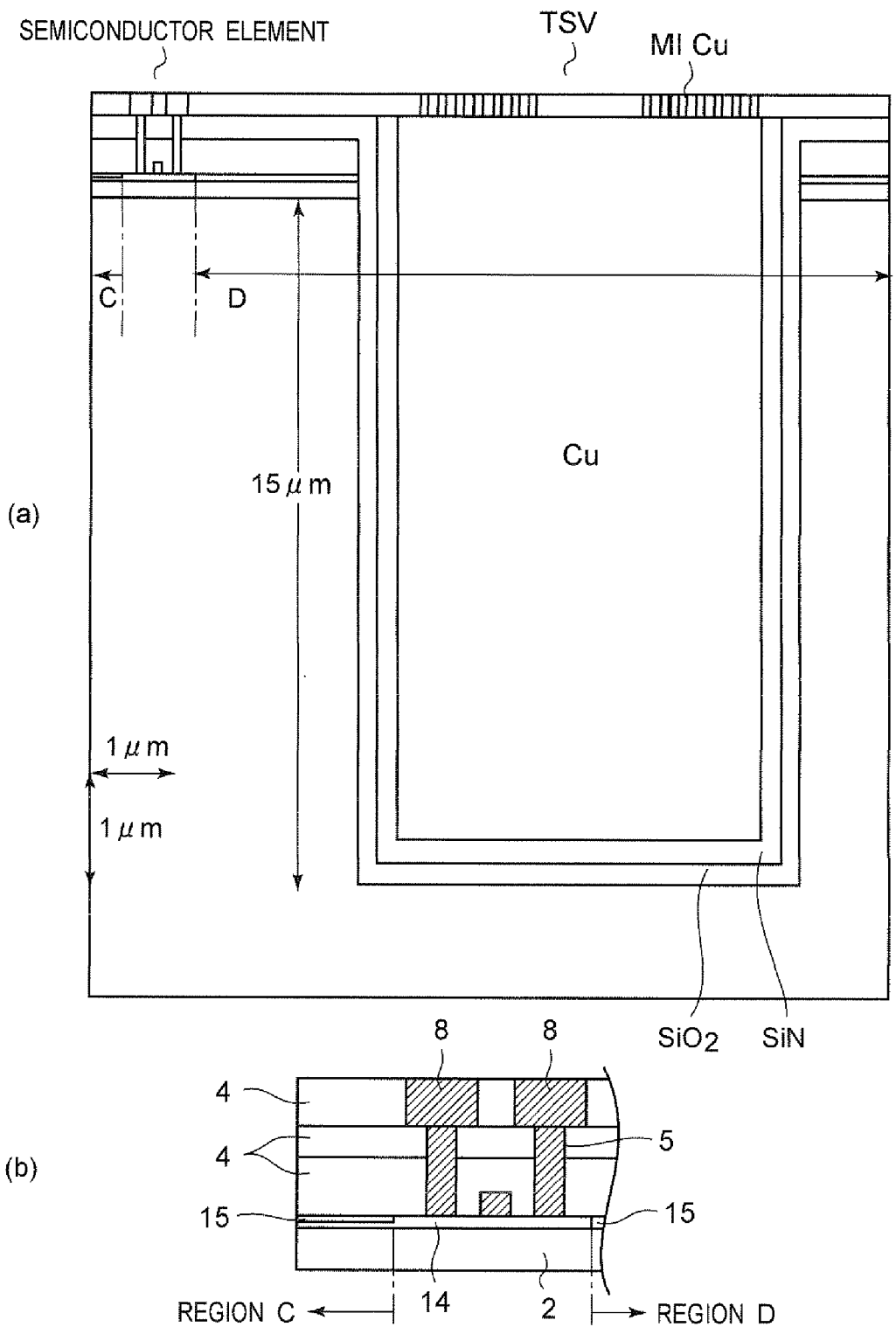
FIG. 21 is a cross-sectional view of steps of producing the semiconductor device according to the ninth embodiment of the present invention.

As shown in FIG. 20, the SiN film is removed with a material such as phosphoric acid except for the inside of the opening part. By removing the dished SiN film, an effect of the dishing can be eliminated.

As shown in FIG. 21(a), after an insulation layer is formed, a contact part is formed of a material such as W in a transistor part, and a layer M1 is made of Cu on the TSV. A region C between semiconductor elements such as a transistor and a capacitor is isolated by a partial isolation structure A, and a region D in which the TSV is formed is isolated by a full isolation structure B. Note that the region C may be isolated by the full isolation structure B or the hybrid isolation structure.

FIG. 21(b) is an enlarged cross-sectional view showing a periphery of the semiconductor elements shown in FIG. 21(a). The region C has the partial isolation structure in which an isolation insulation layer 15 does not reach the BOX layer 2, and a conductive semiconductor layer 14 remains therebetween. Meanwhile, the region D has the full insulation structure in which the isolation insulation layer 15 reaches the BOX layer 2. Note that the region C may be isolated by the full isolation structure B or the hybrid isolation structure.

Thus, the effect of the dishing can be eliminated by using the laminated films of SiN/$SiO_2$ as the barrier film. As a result, a distance between the semiconductor element and the TSV can be small, so that the semiconductor device can be miniaturized.

Tenth Embodiment

Figure 22:
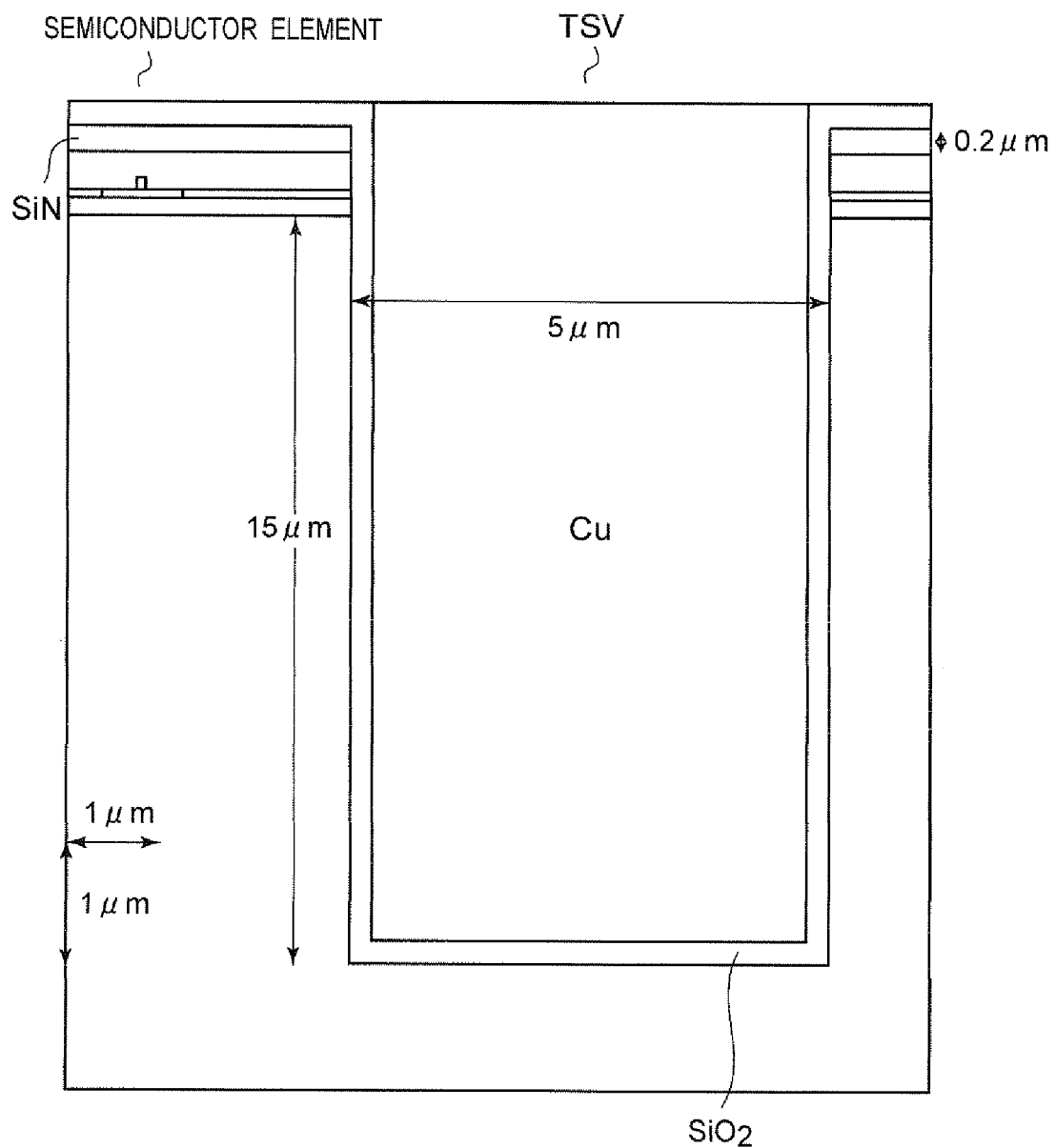
FIG. 22 is a cross-sectional view of steps of producing a semiconductor device according to a tenth embodiment of the present invention.
Figure 23:
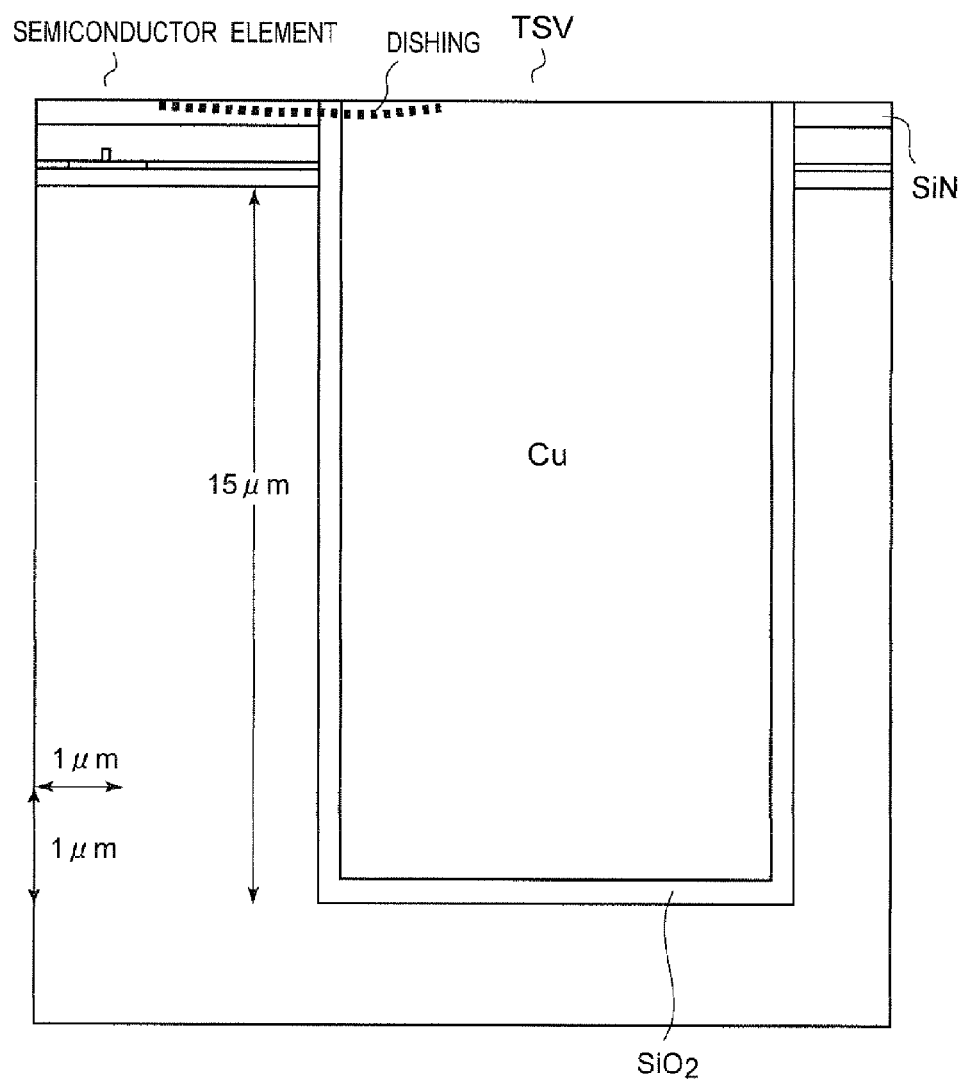
FIG. 23 is a cross-sectional view of steps of producing the semiconductor device according to the tenth embodiment of the present invention.
Figure 24:
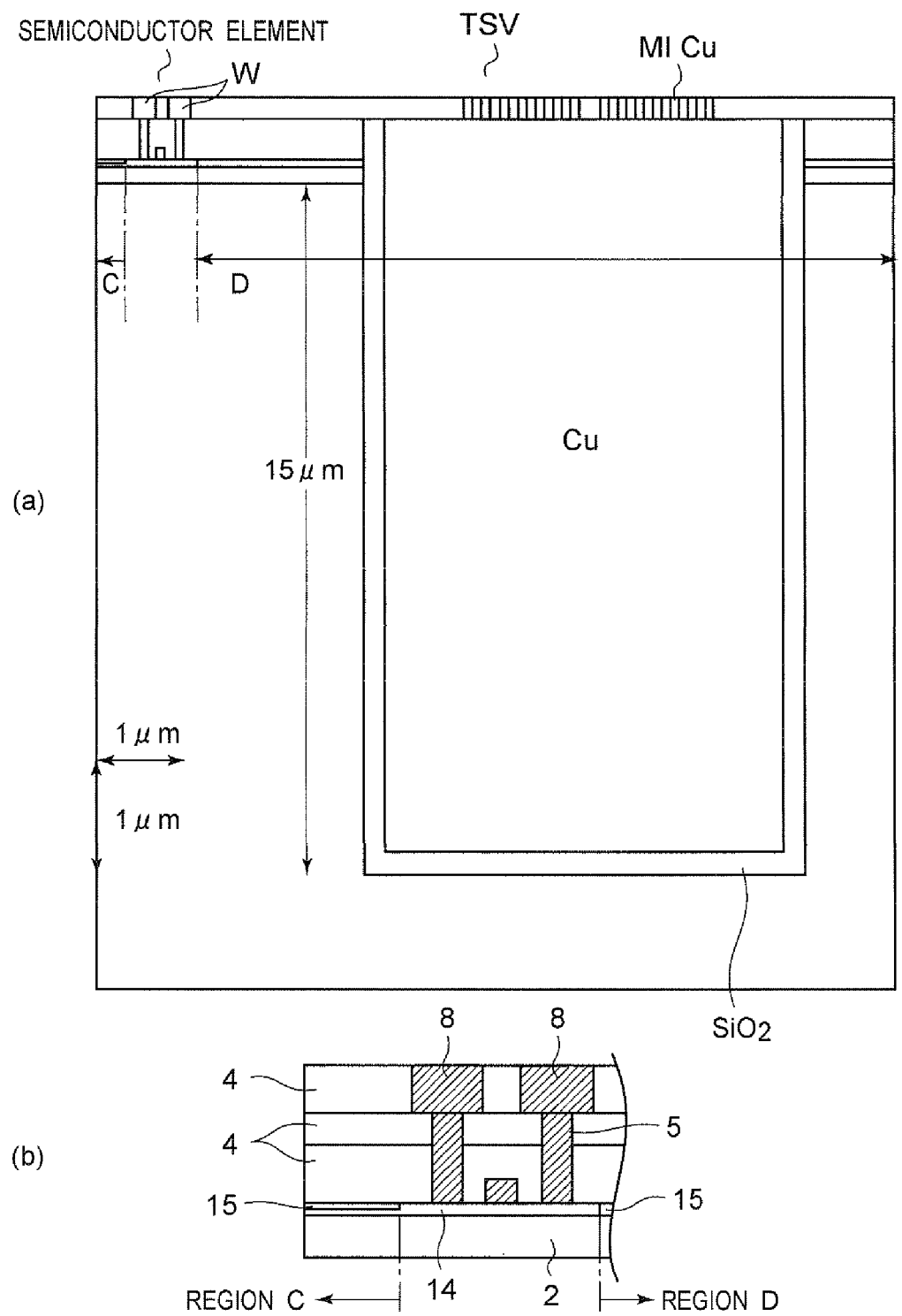
FIG. 24 is a cross-sectional view of steps of producing the semiconductor device according to the tenth embodiment of the present invention.
Figure 25:
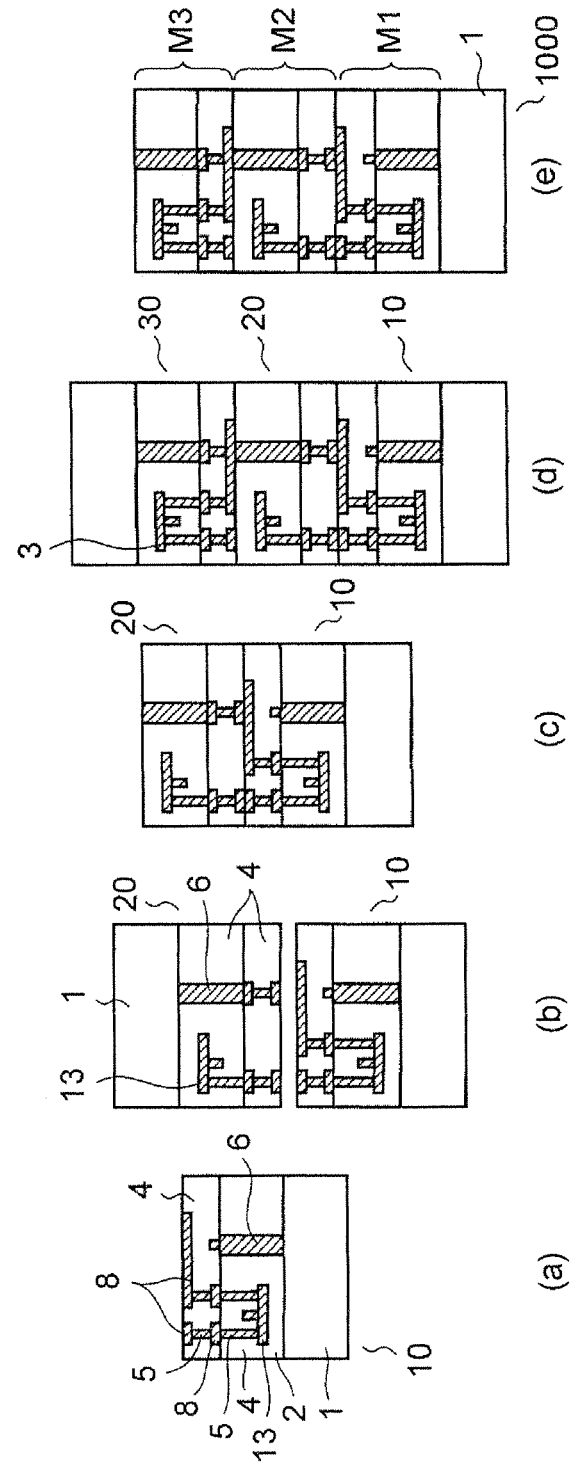
FIG. 25 is a cross sectional view of steps of producing a conventional semiconductor device.

FIGS. 22 to 24 are cross-sectional views of steps of producing a semiconductor device according to a tenth embodiment. In the production steps, an SiN film is formed before a TSV is opened.

As shown in FIG. 22, after the SiN film has been formed on an upper surface of an isolation layer on a substrate, an opening part is formed in the insulation layer using a resist mask. Then, an inside of the opening part is covered with an $SiO_2$ film by a method such as a CVD method.

As shown in FIG. 23, after Cu has been deposited on the whole surface by a method such as a plating method, the material Cu is polished by a method such as a CMP method to form a TSV with Cu remaining in the opening part. The SiN film serves as an etching stopper in the CMP step. In this step, the SiN film around the opening part is subjected to dishing.

As shown in FIG. 24(a), the SiN film is removed with a material such as phosphoric acid except for the inside of the opening part. By removing the dished SiN film, an effect of the dishing can be eliminated. Then, after an insulation layer has been formed, a contact part is formed of a material such as W in a semiconductor element part, and a layer M1 is formed of Cu on the TSV. A region C between semiconductor elements such as a transistor and a capacitor is isolated by a partial isolation structure A, and a region D of the TSV is isolated by a full isolation structure B. Note that the region C may be isolated by the full isolation structure B or the hybrid isolation structure.

FIG. 24(b) is an enlarged cross-sectional view showing a periphery of the semiconductor elements shown in FIG. 24(a). The region C has the partial isolation structure in which an isolation insulation layer 15 does not reach a BOX layer 2, and a conductive semiconductor layer 14 remains therebetween. Meanwhile, the region D has the full insulation structure in which the isolation insulation layer 15 reaches the BOX layer 2. Note that the region C may be isolated by the full isolation structure B or the hybrid isolation structure.

Thus, the effect of the dishing around the opening part can be eliminated by forming the SiN film on the upper surface of the insulation layer. As a result, a distance between the semiconductor element and the TSV can be small, so that the semiconductor device can be miniaturized.

In addition, while the description has been made of the semiconductor device having the two-layer structure or the three-layer structure in the above first to tenth embodiments, the present invention can be applied to another multilayer structure having four or more layers.

What is claimed is:

1. A method for producing a semiconductor device provided in such a manner that a first layer and a second layer are laminated to ensure that their TSVs are arranged in almost a straight line, comprising:
    first layer production step comprising steps of preparing a substrate, forming a transistor of an input/output circuit on an upper surface of the substrate, forming an insulation layer so as to contact with and cover the transistor, and forming a TSV (Through Silicon Via) so as to penetrate through the insulation layer;
    second layer production step comprising steps of preparing a substrate, forming a transistor of a logic circuit on an upper surface of the substrate, forming an insulation layer so as to contact with and cover the transistor, and forming a TSV so as to penetrate through the insulation layer;
    a connection step of connecting surfaces of the first layer and the second layer on a side opposite to substrates of the first layer and the second layer to ensure that the TSV of the first layer and the TSV of the second layer are arranged in almost a straight line; and
    a step of removing the substrate of the first layer, wherein at least one of the first and second layer production steps further comprises the step of forming at least one wiring contacting the TSV, and
    the at least one wiring is smaller in width than the TSV.

2. The method according to claim 1, wherein the connection step comprises a step of connecting a third layer having a TSV and a transistor to the second layer to ensure that the TSVs of the respective layers are arranged in almost a straight line.

3. The method according to claim 1, wherein the first layer production step further comprises a step of connecting a support substrate on the upper surface side of the first layer and then removing the substrate.

4. The method according to claim 1, wherein the transistor is one of an SOI transistor and a bulk transistor.

5. The method according to claim 1, wherein the first layer and/or the second layer production steps comprises:
    a step of preparing an SOI substrate having a structure provided by laminating a semiconductor substrate, an insulation layer, and a semiconductor layer in this order;
    a step of forming a first isolation insulation film in a main surface of the semiconductor layer so as to reach the insulation layer;
    a step of forming a MOS transistor in an element formation region defined by the first isolation insulation film, in the semiconductor layer;
    a step of forming an interlayer insulation layer on the MOS transistor and the first isolation insulation layer;
    a step of forming a second isolation insulation film from the main surface of the semiconductor layer so as not to reach an upper surface of the insulation layer; and
    a step of forming a TSV in the first isolation insulation layer.

6. The method according to claim 5, wherein the MOS transistor comprises:
    a source region and a drain region having a first conductivity type and being selectively formed in the semiconductor layer;
    a gate electrode formed with a gate oxide film interposed therebetween, on a region of the semiconductor layer provided between the source region and the drain region;
    a body region having a second conductivity type of the semiconductor layer provided between the source region and the drain region; and
    a semiconductor region under the second isolation insulation film, having the second conductivity type of a part of the semiconductor layer provided between the second isolation insulation layer and the insulation layer, and further comprises:
    a first body potential setting region having the second conductivity type and being connected to the body region through the semiconductor region under the second isolation insulation film.

7. The method according to claim 1, wherein the step of forming the TSV comprises steps of forming an opening part in the insulation layer, sequentially forming a silicon oxide film and a silicon nitride film so as to cover surfaces of the opening part and the insulation layer, forming a metal layer on the insulation layer so as to be embedded in the opening part, and etching the metal layer using the silicon nitride film as an etching stopper to leave the metal layer in the opening part.

8. The method according to claim 1, wherein the step of forming the TSV comprises steps of forming an opening part in the insulation layer after forming a silicon nitride film on the insulation layer, forming a silicon oxide film so as to cover a surface of the opening part, forming a metal layer on the insulation layer so as to be embedded in the opening part, and etching the metal layer using the silicon nitride layer as an etching stopper to leave the metal layer in the opening part.

9. The method according to claim 1, wherein
    the insulation layer of the first layer has a first surface facing the substrate and a second surface opposite to the first surface, the TSV of the first layer penetrates through the insulation layer, the TSV reaching the first and second surfaces, the insulation layer of the second layer has a first surface facing the substrate and a second surface opposite to the first surface, and the TSV of the second layer penetrates through the insulation layer, the TSV reaching the first and second surfaces.

10. The method according to claim 1, wherein the transistor of the input/output circuit and the transistor of the logic circuit are formed in a semiconductor layer of the substrate, and the bottom of the TSV is formed below the bottom of the semiconductor layer.

11. A semiconductor device having a two-layer structure including at least:
- a first layer including a substrate, a first transistor of an input/output circuit formed on an upper surface of the substrate, a first interlayer insulation layer formed so as to contact with and cover the first transistor, and a TSV (Through Silicon Via) penetrating through the first interlayer insulation layer; and
- a second layer including a second transistor of a logic circuit formed on the first layer, a second interlayer insulation layer formed so as to contact with and cover the second transistor, and a TSV penetrating through the second interlayer insulation layer, wherein the TSV of the first layer and the TSV of the second layer are arranged so as to be provided in almost a straight line, the gate electrode side of the first transistor of the first layer is arranged so as to be opposed to the second layer, and the gate electrode side of the second transistor is arranged so as to be opposed to the first layer, at least one of the first and second layers further comprises at least one wiring contacting the TSV, and the at least one wiring is smaller in width than the TSV.

12. The semiconductor device according to claim 11, wherein the transistor is an SOI transistor or a bulk transistor.

13. The semiconductor device according to claim 11, wherein the first layer and/or the second layer comprises:
- an SOI substrate provided by laminating a semiconductor substrate, an insulation layer, and a semiconductor layer in this order;
- a first isolation insulation film formed in a main surface of the semiconductor layer so as to reach the insulation layer;
- a MOS transistor formed in an element formation region defined by the first isolation insulation film, in the semiconductor layer;
- an interlayer insulation film formed on the MOS transistor and the first isolation insulation layer;
- a second isolation insulation film formed from the main surface of the semiconductor layer so as not to reach an upper surface of the insulation layer; and
- a TSV formed in the first isolation insulation film.

14. The semiconductor device according to claim 13, wherein the MOS transistor comprises:
- a source region and a drain region having a first conductivity type and being selectively formed in the semiconductor layer;
- a gate electrode formed with a gate oxide film interposed therebetween, on a region of the semiconductor layer between the source region and the drain region;
- a body region having a second conductivity type of the semiconductor layer provided between the source region and the drain region; and
- a semiconductor region under the second isolation insulation film, having the second conductivity type of a part of the semiconductor layer provided between the second isolation insulation layer and the insulation layer, and further comprises:
- a first body potential setting region having the second conductivity type and being connected to the body region through the semiconductor region under the second isolation insulation film.

15. The semiconductor device according to claim 11, wherein
the first interlayer insulation layer of the first layer has a first surface facing the substrate and a second layer opposite to the first surface, the first TSV penetrates through the first interlayer insulation layer, the TSV reaching the first and second surfaces, the second interlayer insulation layer of the second layer has a first surface facing the substrate and a second surface opposite to the first surface, and the second TSV penetrates through the second interlayer insulation layer, the TSV reaching the first and second surfaces.

16. The semiconductor device according to claim 9, wherein the first transistor and the second transistor are formed in a semiconductor layer of the substrate, and the bottom of the TSV is formed below the bottom of the semiconductor layer.

* * * * *